United States Patent
Kim et al.

(10) Patent No.: US 9,842,637 B2
(45) Date of Patent: Dec. 12, 2017

(54) MAGNETIC MEMORY DEVICE AND METHOD OF FABRICATING THE SAME

(71) Applicants: Ki Woong Kim, Hwaseong-si (KR); Juhyun Kim, Hwaseong-si (KR); Yong Sung Park, Suwon-si (KR); Sechung Oh, Yongin-si (KR); Joonmyoung Lee, Anyang-si (KR); Woo Chang Lim, Seongnam-si (KR)

(72) Inventors: Ki Woong Kim, Hwaseong-si (KR); Juhyun Kim, Hwaseong-si (KR); Yong Sung Park, Suwon-si (KR); Sechung Oh, Yongin-si (KR); Joonmyoung Lee, Anyang-si (KR); Woo Chang Lim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/339,064

(22) Filed: Oct. 31, 2016

(65) Prior Publication Data

US 2017/0170387 A1 Jun. 15, 2017

(30) Foreign Application Priority Data

Dec. 10, 2015 (KR) ........................ 10-2015-0176050

(51) Int. Cl.
| | | |
|---|---|---|
| H01L 21/00 | (2006.01) | |
| H01L 29/82 | (2006.01) | |
| G11C 11/16 | (2006.01) | |
| H01L 43/08 | (2006.01) | |
| H01L 43/10 | (2006.01) | |

(Continued)

(52) U.S. Cl.
CPC ........ *G11C 11/1657* (2013.01); *G11C 11/161* (2013.01); *G11C 11/1655* (2013.01); *G11C 11/1673* (2013.01); *G11C 11/1675* (2013.01); *H01L 27/228* (2013.01); *H01L 43/08* (2013.01); *H01L 43/10* (2013.01); *H01L 43/12* (2013.01)

(58) Field of Classification Search
CPC ....... H01L 43/08; H01L 43/10; H01L 27/222; H01L 27/224; G11C 11/161; G11B 5/374; G11B 5/3903; G11B 5/3906; G11B 5/3909; G01R 33/066; G01R 33/09; G01R 33/098
USPC .............................. 438/3; 257/421, 422, 427
See application file for complete search history.

(56) References Cited

U.S. PATENT DOCUMENTS

| | | |
|---|---|---|
| 6,347,049 B1 | 2/2002 | Childress et al. |
| 6,974,708 B2 | 12/2005 | Horng et al. |
| 7,488,609 B1 | 2/2009 | Lin et al. |

(Continued)

FOREIGN PATENT DOCUMENTS

| | | |
|---|---|---|
| JP | 4862564 B2 | 1/2012 |
| KR | 100783307 B1 | 12/2007 |

*Primary Examiner* — Hsien Ming Lee
(74) *Attorney, Agent, or Firm* — Sughrue Mion, PLLC

(57) ABSTRACT

A magnetic memory device and a method of fabricating the same are provided. The method includes forming a first magnetic layer on a substrate, forming a tunnel barrier layer on the first magnetic layer, and forming a second magnetic layer on the tunnel barrier layer. The forming of the tunnel barrier layer includes forming a first metal oxide layer on the first magnetic layer, forming a first metal layer on the first metal oxide layer, forming a second metal oxide layer on the first metal layer, and performing a first thermal treatment process to oxidize at least a portion of the first metal layer.

20 Claims, 26 Drawing Sheets

(51) Int. Cl.
*H01L 43/12* (2006.01)
*H01L 27/22* (2006.01)

(56) References Cited

U.S. PATENT DOCUMENTS

| | | | |
|---|---|---|---|
| 7,888,756 B2 | 2/2011 | Mather et al. | |
| 7,933,100 B2 | 4/2011 | Nakabayashi et al. | |
| 8,202,572 B2 | 6/2012 | Zhao et al. | |
| 8,337,676 B2 | 12/2012 | Zhao et al. | |
| 8,878,318 B2 | 11/2014 | Chen et al. | |
| 9,093,639 B2 | 7/2015 | Kaiser et al. | |
| 2002/0114112 A1* | 8/2002 | Nakashio | B82Y 10/00 360/324.2 |
| 2005/0226052 A1 | 10/2005 | Horng et al. | |
| 2008/0232002 A1 | 9/2008 | Mather et al. | |
| 2008/0253038 A1 | 10/2008 | Nakabayashi et al. | |
| 2010/0320076 A1 | 12/2010 | Zhao et al. | |
| 2012/0128870 A1 | 5/2012 | Zhao et al. | |
| 2012/0235258 A1 | 9/2012 | Zhao et al. | |
| 2013/0075839 A1 | 3/2013 | Chen et al. | |
| 2013/0216702 A1 | 8/2013 | Kaiser et al. | |

* cited by examiner

MAGNETIC MEMORY DEVICE AND METHOD OF FABRICATING THE SAME

CROSS-REFERENCE TO RELATED APPLICATION

This application claims priority under 35 U.S.C. §119 from Korean Patent Application No. 10-2015-0176050, filed on Dec. 10, 2015, in the Korean Intellectual Property Office, the entire contents of which are hereby incorporated by reference.

BACKGROUND

Apparatuses and methods consistent with example embodiments relate to a semiconductor device and a method of fabricating the same, and in particular, to a magnetic memory device including a magnetic tunnel junction and a method of fabricating the same.

Due to increased demand for electronic devices with a fast speed and/or a low power consumption, semiconductor devices require a fast operating speed and/or a low operating voltage. For example, a magnetic memory device which can provide technical advantages, such as low latency and non-volatility, has been suggested to satisfy such requirements. As a result, the magnetic memory device is currently regarded as an emerging next-generation memory device.

The magnetic memory device may include a magnetic tunnel junction (MTJ). The MTJ may include two magnetic layers and a tunnel barrier layer interposed therebetween. Resistance of the MTJ may vary depending on magnetization directions of the magnetic layers. For example, the resistance of the MTJ may be higher when magnetization directions of the magnetic layers are anti-parallel than when they are parallel. Such a difference in resistance can be used to store data in a magnetic memory device. However, more research is needed to mass-produce the magnetic memory device.

SUMMARY

One or more example embodiments provide a method of fabricating a magnetic memory device with an improved magnetoresistance ratio.

Further, one or more example embodiments provide a magnetic memory device with an improved magnetoresistance ratio.

According to an aspect of an example embodiment, there is provided a method of fabricating a magnetic memory device, the method including: forming a first magnetic layer on a substrate; forming a tunnel barrier layer on the first magnetic layer; and forming a second magnetic layer on the tunnel barrier layer, the forming of the tunnel barrier layer including: forming a first metal oxide layer on the first magnetic layer; forming a first metal layer on the first metal oxide layer; forming a second metal oxide layer on the first metal layer; and performing a first thermal treatment process to oxidize at least a portion of the first metal layer.

BRIEF DESCRIPTION OF THE DRAWINGS

The above, and/or other aspects will become apparent and more clearly understood from the following description taken in conjunction with the accompanying drawings. The accompanying drawings represent non-limiting, example embodiments as described herein.

Figure 1:
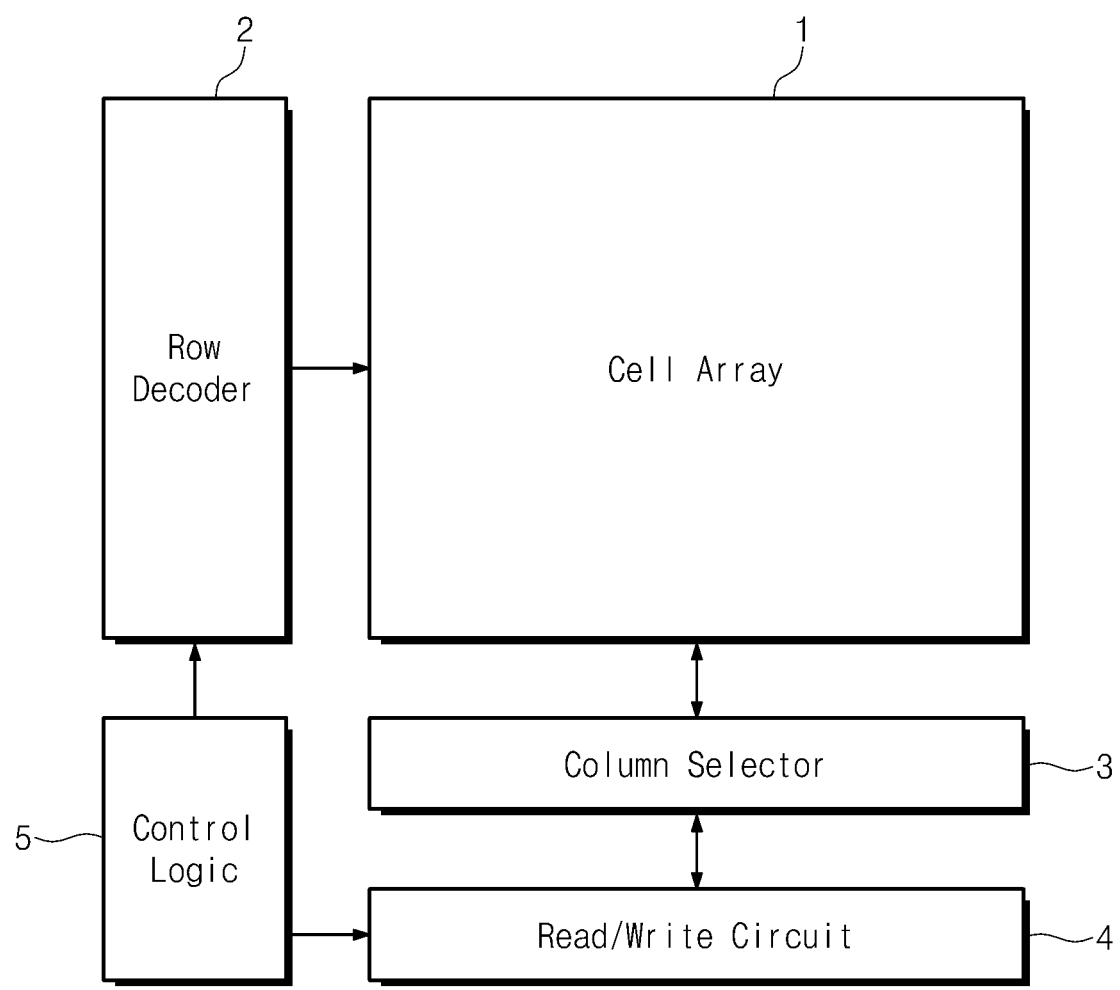
FIG. 1 is a block diagram of a magnetic memory device according to one or more example embodiments.

It should be noted that these figures are intended to illustrate the general characteristics of methods, structure and/or materials utilized in example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments.

DETAILED DESCRIPTION

Example embodiments will now be described more fully hereinafter with reference to the accompanying drawings, in which example embodiments of the inventive concepts are shown. The same reference numerals or the same reference designators denote the same elements throughout the specification.

FIG. 1 is a block diagram of a magnetic memory device according to one or more example embodiments.

Referring to FIG. 1, a magnetic memory device may include a memory cell array 1, a row decoder 2, a column selection circuit 3, a read/write circuit 4, and a control logic 5.

The memory cell array 1 may include a plurality of word lines, a plurality of bit lines, and a plurality of memory cells, which are provided at respective intersections of the word and bit lines. Configuration of the memory cell array 1 will be described in more detail with reference to FIG. 2.

The row decoder 2 may be connected to the memory cell array 1 through the word lines. The row decoder 2 may be configured to select at least one of the word lines, based on received address information.

The column selection circuit 3 may be connected to the memory cell array 1 through the bit lines to select at least one of the bit lines, based on address information input from the outside. The at least one of the bit lines selected by the column selection circuit 3 may be connected to the read/write circuit 4.

The read/write circuit 4 may provide a bit line bias, which will be used to access selected memory cells based on control of the control logic 5. For example, the read/write circuit 4 may provide a bit line voltage to a selected bit line, and the bit line voltage may be used to perform an operation of reading or writing data from or to the selected memory cells, in response to control of the control logic 5.

The control logic 5 may output control signals for controlling the semiconductor memory device, based on command signals provided from the outside. The read/write circuit 4 may be controlled by the control signals output from the control logic 5.

Figure 2:
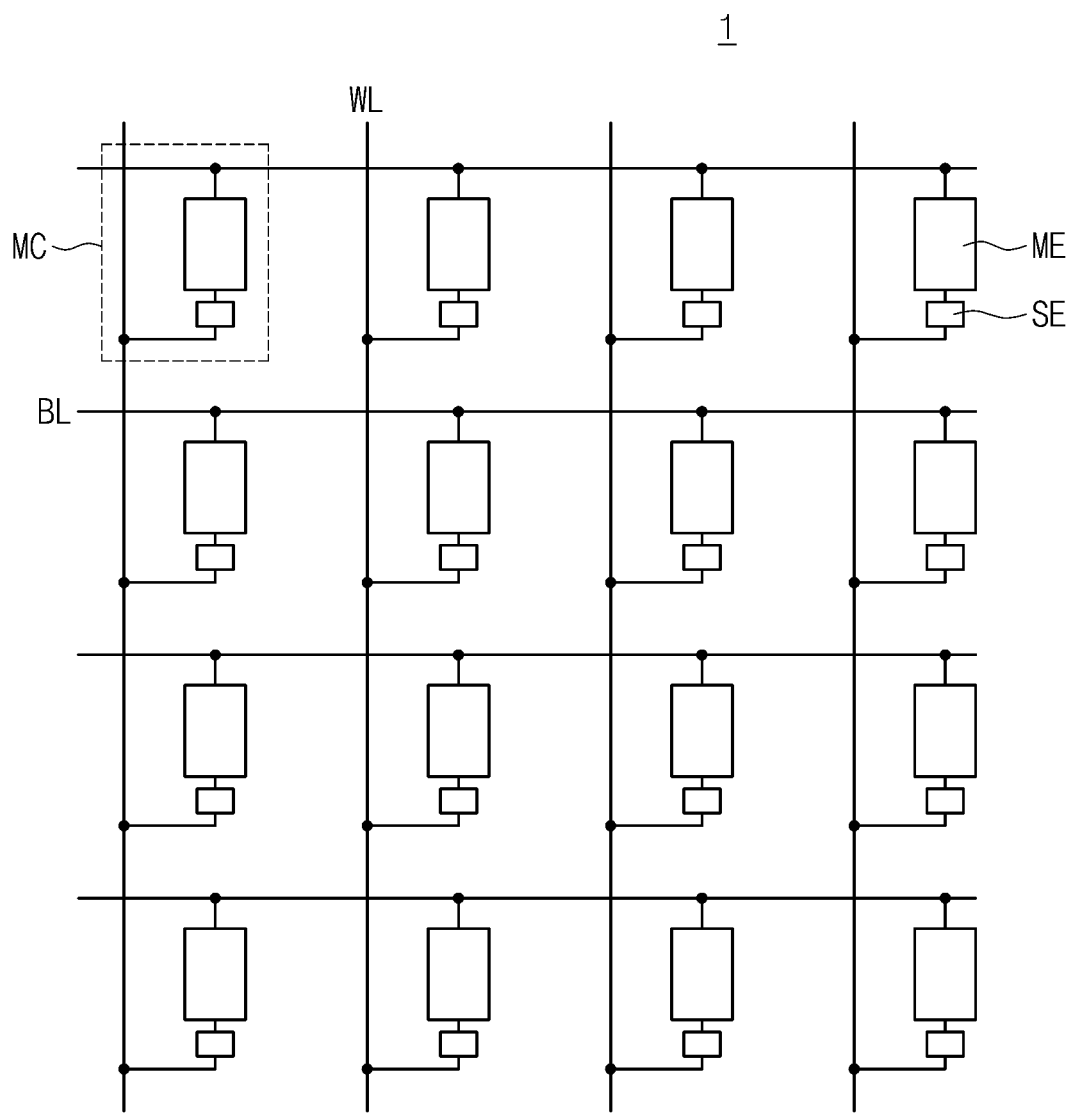
FIG. 2 is a circuit diagram of a memory cell array of a magnetic memory device according to one or more example embodiments.

FIG. 2 is a circuit diagram of a memory cell array of a magnetic memory device according to one or more example embodiments.

Referring to FIG. 2, a memory cell array 1 may include a plurality of first conductive lines, a plurality of second conductive lines, and a plurality of memory cells MC. In one or more example embodiments, the first conductive lines may serve as word lines WL, and the second conductive lines may serve as bit lines BL. The memory cells MC may be two- or three-dimensionally provided. The word lines WL and the bit lines BL may be provided to cross each other, and each of the memory cells MC may be provided at a corresponding intersection of the word lines WL and the bit lines BL. Each of the word lines WL may be connected to a plurality of the memory cells MC. Each of the bit lines BL may be connected to a corresponding one of the memory cells MC connected to each of the word lines WL. Here, the memory cells MC may be connected to the read and write circuit 40, described with reference to FIG. 1, through the bit lines BL.

Each of the memory cells MC may include a memory element ME and a selection element SE. The memory element ME may be provided between and connected to the bit line BL and the selection element SE, and the selection element SE may be provided between and connected to the memory element ME and the word line WL. The memory element ME may be a variable resistance device, whose resistance can be switched to one of at least two values, depending on an electric pulse applied thereto.

In one or more example embodiments, the memory element ME may be formed to have a layered structure, whose electric resistance can by changed by a spin transfer process using an electric current passing therethrough. For example, the memory element ME may have a layered structure configured to exhibit a magneto-resistance property and may include at least one ferromagnetic material and/or at least one antiferromagnetic material. In one or more example embodiments, the memory element ME may be a magnetic memory element with a magnetic tunnel junction MJT.

The selection element SE may be configured to selectively control an electric current passing through the memory element ME. For example, the selection element SE may be one of a diode, a PNP bipolar transistor, an NPN bipolar transistor, an NMOS field effect transistor, and a PMOS field effect transistor. In the case that the selection element SE is a three-terminal device (e.g., a bipolar transistor or a MOS field effect transistor), an additional interconnection line may be connected to the selection element SE.

Figure 3:
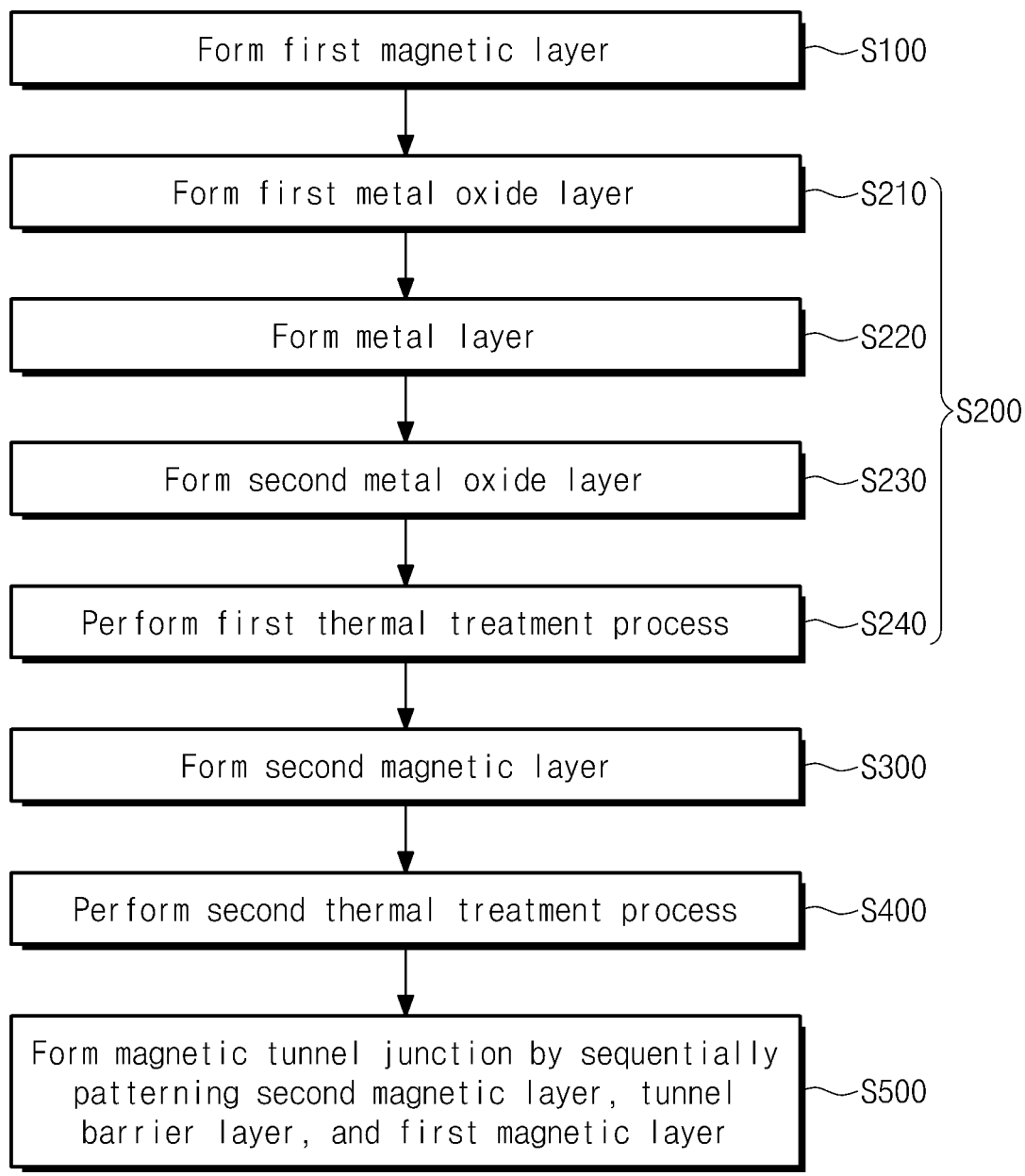
FIG. 3 is a flow chart illustrating a method of fabricating a memory device according to one or more example embodiments.

Hereinafter, a method of fabricating the memory element ME according to one or more example embodiments will be described. FIG. 3 is a flow chart illustrating a method of fabricating a memory device according to one or more example embodiments. FIGS. 4, 5A, 6A, 7A, 10, and 11A are sectional views illustrating a method of fabricating a memory device according to one or more example embodiments. FIGS. 5B, 6B, 7B, and 11B are enlarged views corresponding to portions 'A' of FIGS. 5A, 6A, 7A, and 11A, respectively. FIG. 7C is an enlarged view corresponding to a portion 'A' of FIG. 7A, and FIGS. 11C and 11D are enlarged views corresponding to a portion 'A' of FIG. 11A. FIGS. 12A and 12B are conceptual diagrams illustrating a magnetic tunnel junction according to one or more example embodiments.

Figure 4:
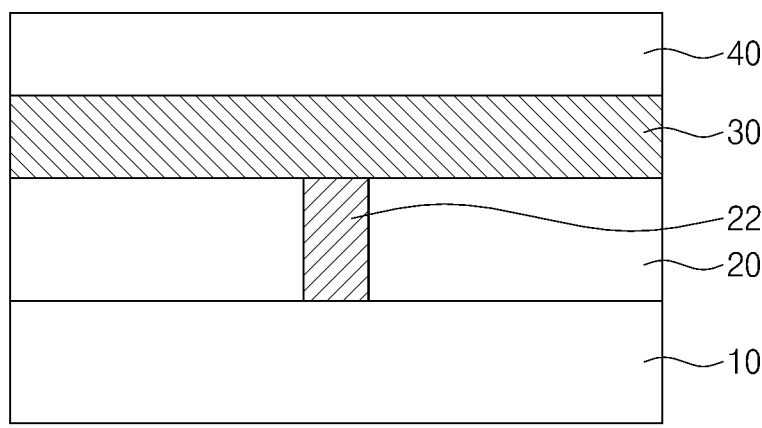
FIG. 4 is a sectional view illustrating a memory device according to one or more example embodiments.

Referring to FIGS. 3 and 4, a substrate 10 may be provided. The substrate 10 may be a silicon wafer, a germanium wafer, and/or a silicon-germanium wafer. The substrate 10 may include a conductive region.

A lower interlayered insulating layer 20 may be formed on the substrate 10. The lower interlayered insulating layer 20 may be formed of oxide (e.g., silicon oxide), nitride (e.g., silicon nitride), and/or oxynitride (e.g., silicon oxynitride). A contact plug 22 may be formed in the lower interlayered insulating layer 20 and may be connected to a conductive region. The contact plug 22 may be formed of, or include doped semiconductor materials (e.g., doped silicon), metals (e.g., tungsten, aluminum, titanium, and/or tantalum), conductive metal nitrides (e.g., titanium nitride, tantalum nitride, and/or tungsten nitride), or metal-semiconductor compounds (e.g., metal silicides).

A bottom electrode layer 30 may be formed on the lower interlayered insulating layer 20. The bottom electrode layer 30 may be overlapped with the contact plug 22 and may be connected to the contact plug 22. The bottom electrode layer 30 may be formed of, or include at least one of conductive metal nitrides (e.g., titanium nitride and tantalum nitride), transition metals (e.g., titanium and tantalum), and rare-earth metals (e.g., ruthenium and platinum).

A first magnetic layer 40 may be formed on the bottom electrode layer 30 (in S100). The first magnetic layer 40 may be a fixed layer with a fixed magnetization direction or a free layer with a switchable magnetization direction.

In one or more example embodiments, the first magnetic layer 40 may have a magnetization direction that is substantially perpendicular to an interface between the first magnetic layer 40 and a non-magnetic layer to be formed on the first magnetic layer 40. In this case, the first magnetic layer 40 may include at least one of perpendicular magnetic materials (e.g., CoFeTb, CoFeGd, and CoFeDy), $L1_0$ perpendicular magnetic materials, hexagonal-close-packed (HCP) CoPt-based materials, or perpendicular magnetic structures. The $L1_0$ perpendicular magnetic material may include at least one of $L1_0$ FePt, $L1_0$ FePd, $L1_0$ CoPd, or $L1_0$ CoPt. The perpendicular magnetic structures may include magnetic layers and non-magnetic layers that are alternatingly and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n or (CoCr/Pd)n, where n is the number of stacked pairs of the layers.

In example embodiments, the first magnetic layer 40 may be configured to have a magnetization direction that is substantially parallel to an interface between the first magnetic layer 40 and a non-magnetic layer to be formed on the first magnetic layer 40. In this case, the first magnetic layer 40 may be formed of, or include a ferromagnetic material. In the case where the first magnetic layer 40 is a fixed layer, the first magnetic layer 40 may further include an anti-ferromagnetic material fixing a magnetization direction of the ferromagnetic material. The first magnetic layer 40 may be formed by a physical vapor deposition process or a chemical vapor deposition process.

Thereafter, a process S200 of forming a tunnel barrier layer may be performed to form a tunnel barrier layer 50a (e.g., of FIG. 7A) on the first magnetic layer 40. According to one or more example embodiments, the process S200 of forming the tunnel barrier layer may include step S210 of forming a first metal oxide layer, step S220 of forming a metal layer, step S230 of forming a second metal oxide layer, and step S240 of performing a first thermal treatment process. Accordingly, the tunnel barrier layer 50a may be formed to include at least two metal oxide layers and a metal layer (or an intervening layer) therebetween. Hereinafter, the steps S210, S220, S230, and S240 will be described with reference to the accompanying drawings.

Figure 5A:
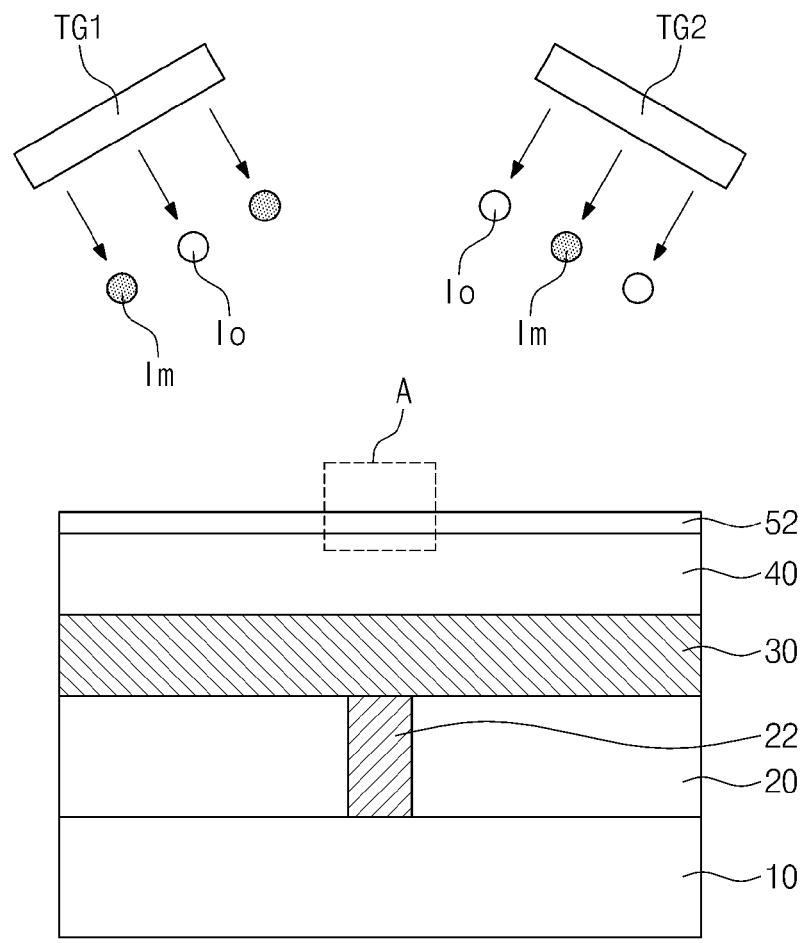
FIG. 5A is a sectional view illustrating a memory device according to one or more example embodiments.
Figure 5B:
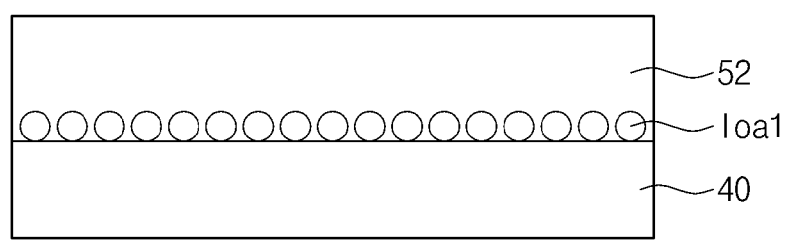
FIG. 5B is an enlarged view corresponding to portion 'A' of FIG. 5A.

Referring to FIGS. 3, 5A, and 5B, a first metal oxide layer 52 may be formed on the first magnetic layer 40 (in S210). The first metal oxide layer 52 may be formed using a sputtering process. For example, the sputtering process may be a radio frequency sputtering (hereinafter, RF sputtering) process using at least one target. In one or more example embodiments, the RF sputtering process may be performed using a plurality of targets. For example, as shown in FIG. 5A, a first target TG1 and a second target TG2 may be used in the RF sputtering process. During the RF sputtering process, the first and second targets TG1 and TG2 may be provided over the substrate 10 and may be spaced apart from each other in a horizontal direction. Each of the first and second targets TG1 and TG2 may be provided to have a bottom surface that is parallel to or at an angle to a top surface of the substrate 10. The first and second targets TG1 and TG2 may be formed of, or include the same metal oxide material. Each of the first and second targets TG1 and TG2 may include at least one of magnesium oxide, titanium oxide, aluminum oxide, magnesium-zinc oxide, or magnesium-boron oxide. However, example embodiments are not limited thereto.

During the RF sputtering process, ion sources may be produced from the first and second targets TG1 and TG2. The ion sources may include a first ion source Im and a second ion source Io, which are produced from the first and second targets TG1 and TG2, respectively. The first ion source Im may include a metal element (e.g., Mg), and the second ion source Io may include oxygen ions and/or oxygen radicals. The first and second ion sources Im and Io may be deposited on the first magnetic layer 40 to form the first metal oxide layer 52.

The first metal oxide layer 52 may contain substantially the same material as the first and second targets TG1 and TG2. For example, the first metal oxide layer 52 may include at least one of magnesium oxide, titanium oxide, aluminum oxide, magnesium-zinc oxide, or magnesium-boron oxide. At this stage, at least a portion of the first metal oxide layer 52 may be in an amorphous state.

After the RF sputtering process, a remnant ion source Ioa1 may remain between the first magnetic layer 40 and the first metal oxide layer 52. The remnant ion source Ioa1 may be a part of the second ion source Io that does not participate in the reaction process for forming the first metal oxide layer 52. For example, as shown in FIG. 5B, the remnant ion source Ioa1 may be positioned adjacent to an interface between the first magnetic layer 40 and the first metal oxide layer 52. Because the second ion source Io has a mean free path that is longer than that of the first ion source Im, the second ion source Io may easily reach a surface of the first magnetic layer 40. Here, the unreacted part of the second ion source Io may be accumulated adjacent to the surface of the first magnetic layer 40. However, example embodiments are not limited thereto. The remnant ion source Ioa1 may be randomly distributed in the first metal oxide layer 52. In the case where the remnant ion source Ioa1 is excessively accumulated on the surface of the first magnetic layer 40, the remnant ion source Ioa1 may disturb a spin dependent tunneling of a magnetic tunnel junction, and as a result, the magnetic tunnel junction may have an increased resistive area RA and a decreased magnetoresistance ratio TMR.

According to one or more example embodiments, it is possible to prevent the problems caused by an excessive amount of the remnant ion source Ioa1. For example, in the case where the first metal oxide layer 52 is formed by a sputtering process using a plurality of targets (e.g., TG1 and TG2), the first metal oxide layer 52 may be deposited at a relatively high deposition rate. As a result, during the formation of the first metal oxide layer 52, a production amount of the remnant ion source Ioa1 may be relatively reduced, when compared to the case that the deposition rate is slow.

Figure 6A:
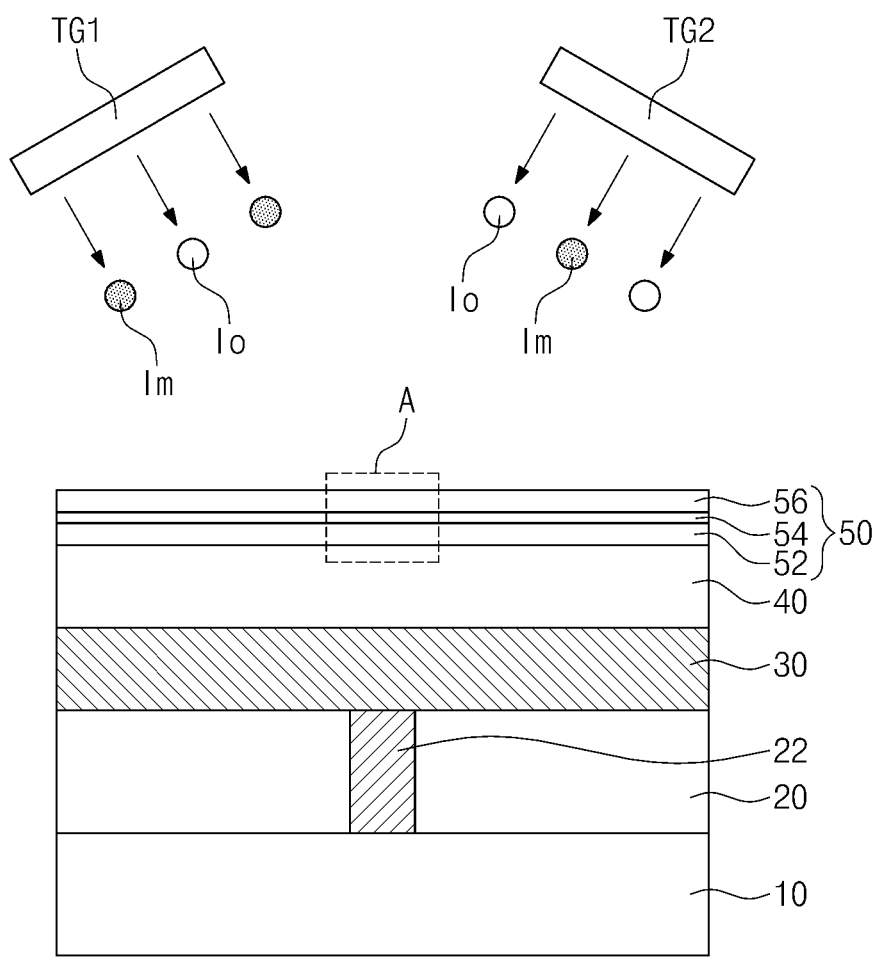
FIG. 6A is a sectional view illustrating a memory device according to one or more example embodiments.
Figure 6B:
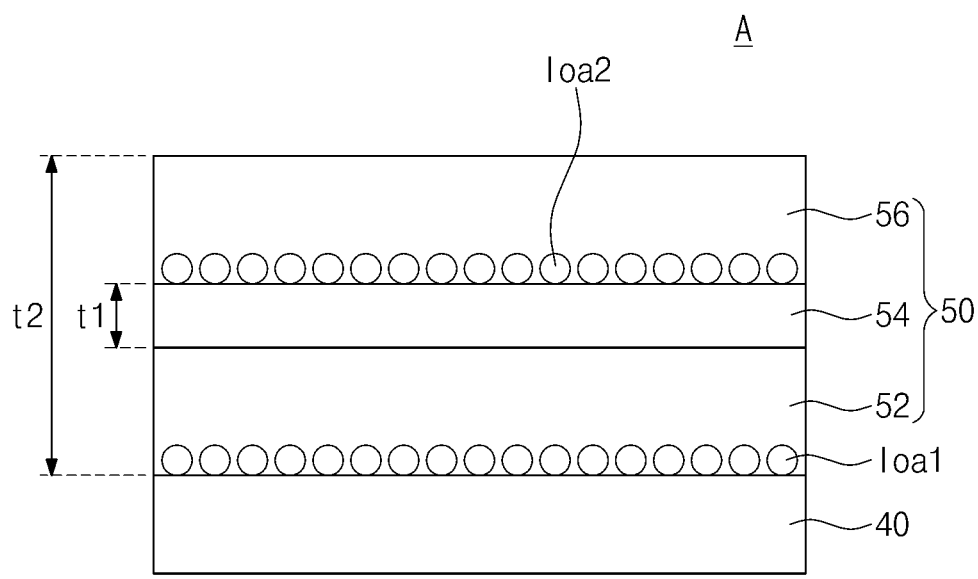
FIG. 6B is an enlarged view corresponding to portion 'A' of FIG. 6A.
Figure 7A:
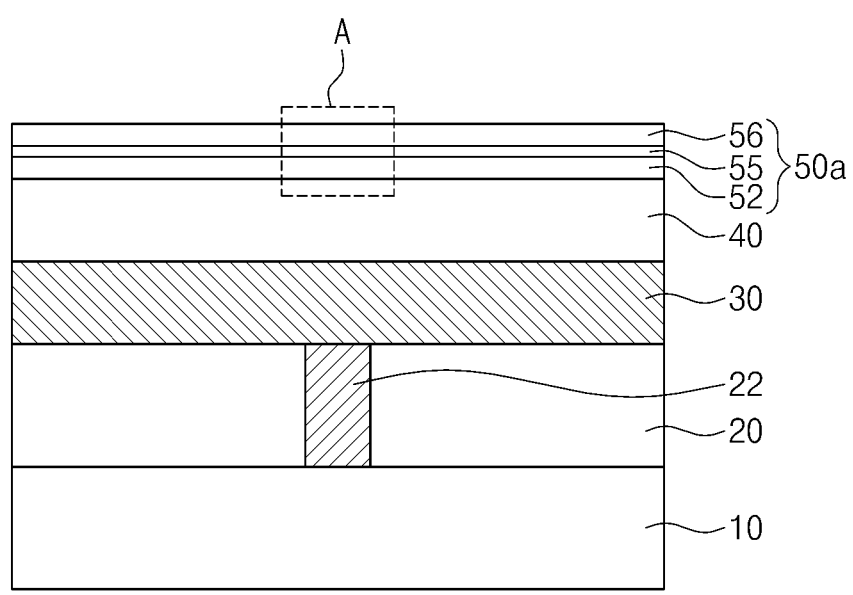
FIG. 7A is a sectional view illustrating a memory device according to one or more example embodiments.

Referring to FIGS. 3, 6A, and 6B, a metal layer 54 may be formed on the first metal oxide layer 52 (in S220). In one or more example embodiments, the metal layer 54 may be formed of a metal material with high oxygen affinity. For example, the metal layer 54 may contain Mg, Fe, Ti, Ta, Al, W, Hf, or V. The metal layer 54 may be formed by an RF sputtering process. In the RF sputtering process for forming the metal layer 54, the metal material with high oxygen affinity may be used as a target material. The process of forming the metal layer 54 may be performed in situ within the same system that forms the first metal oxide layer 52.

In one or more example embodiments, the metal layer 54 may contain the same metal element as that contained in the first metal oxide layer 52. For example, each of the first metal oxide layer 52 and the metal layer 54 may contain magnesium (Mg). In example embodiments, the metal layer 54 may contain a metallic element that is different from that contained in the first metal oxide layer 52. For example, the first metal oxide layer 52 may contain magnesium (Mg), and the metal layer 54 may contain iron (Fe).

The metal layer 54 may be formed to have a first thickness t1. Here, the first thickness t1 may be defined as an average of a vertical distance from an interface between the first metal oxide layer 52 and the metal layer 54 to a top surface of the metal layer 54 (i.e., an interface between the metal layer 54 and a second metal oxide layer 56). The metal layer 54 may be formed in such a way that a ratio of the first thickness t1 to a second thickness t2 is uniform, where the second thickness t2 is a thickness of a preliminary tunnel barrier layer 50 or the tunnel barrier layer 50a. This will again be described below.

A second metal oxide layer 56 may be formed on the metal layer 54 (in S230). The second metal oxide layer 56 may include the same material as the first metal oxide layer 52 and may be formed by the same method used to form the first metal oxide layer 52. For example, the second metal oxide layer 56 may be formed of, or include at least one of magnesium oxide, titanium oxide, aluminum oxide, magnesium-zinc oxide, or magnesium-boron oxide. Furthermore, the second metal oxide layer 56 may be formed by an RF sputtering process using a plurality of targets (e.g., the first and second targets TG1 and TG2). In other words, during the RF sputtering process for forming the second metal oxide layer 56, the first and second ion sources Im and Io produced from the first and second targets TG1 and TG2 may be deposited on the metal layer 54, and as a result, the second metal oxide layer 56 may be formed on the metal layer 54. The process of forming the second metal oxide layer 56 may be performed in situ within the same system used to form the first metal oxide layer 52 and the metal layer 54. At this stage, at least a portion of the second metal oxide layer 56 may be in an amorphous state. Hereinafter, the first metal oxide layer 52, the metal layer 54, and the second metal oxide layer 56 will be referred to as 'a preliminary tunnel barrier layer 50'.

As shown in FIG. 6B, the remnant ion source Ioa2 may remain between the metal layer 54 and the second metal oxide layer 56 (i.e., near an interface between the metal layer 54 and the second metal oxide layer 56), after the formation of the second metal oxide layer 56. The remnant ion source Ioa2 may be a part of the second ion source Io (i.e., oxygen ions and/or oxygen radicals) that does not participate in the reaction process for forming the second metal oxide layer 56. For example, the metal layer 54 may prevent the second ion source Io from reaching the surface of the first magnetic layer 40, when the second metal oxide layer 56 is formed. As a result, because the preliminary tunnel barrier layer 50 is formed to have a structure of metal oxide/metal/metal oxide (e.g., MgO/Mg/MgO), it is possible to prevent the remnant ion source from accumulating on the surface of the first magnetic layer 40 (or on a region adjacent to the interface between the first magnetic layer 40 and the preliminary tunnel barrier layer 50), compared to the case that the preliminary tunnel barrier layer 50 is formed of a single metal oxide layer (e.g., of MgO).

The preliminary tunnel barrier layer 50 may be formed to have a thickness smaller than a spin diffusion distance. For example, the second thickness t2 of the preliminary tunnel barrier layer 50 may range from about 10 Å to about 15 Å. Here, the second thickness t2 may be defined as a mean vertical distance from an interface between the first magnetic layer 40 and the first metal oxide layer 52 to a top surface of the second metal oxide layer 56. According to one or more example embodiments, the first thickness t1 of the metal layer 54 may range from 0.1 to 0.2 times the second thickness t2. In other words, the thickness ratio of t1/t2 may range from 0.1 to 0.2. The first thickness t1 may range from about 1 Å to about 3 Å.

The first and second metal oxide layers 52 and 56 may have substantially the same thickness, but example embodiments are not limited thereto. The first metal oxide layer 52 may be formed to have a thickness that is greater or smaller than that of the second metal oxide layer 56.

Figure 7B:
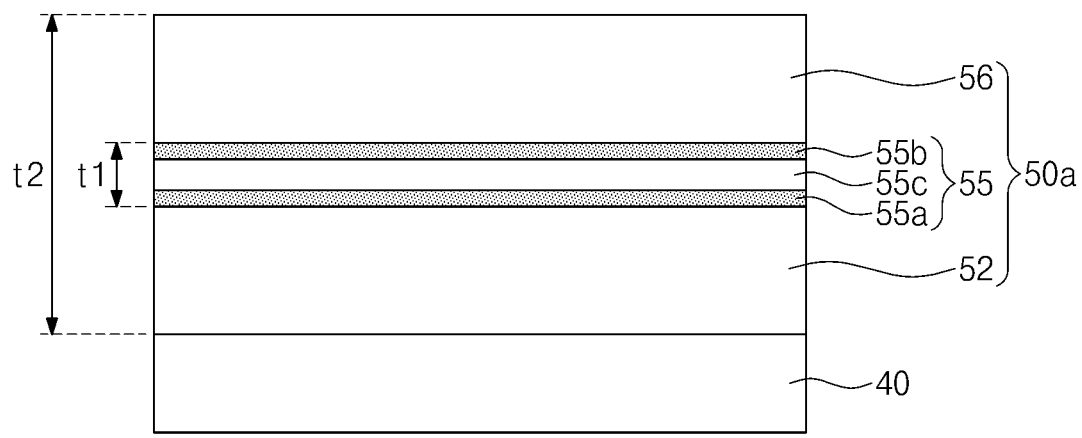
FIG. 7B is an enlarged view corresponding to portion 'A' of FIG. 7A.
Figure 7C:
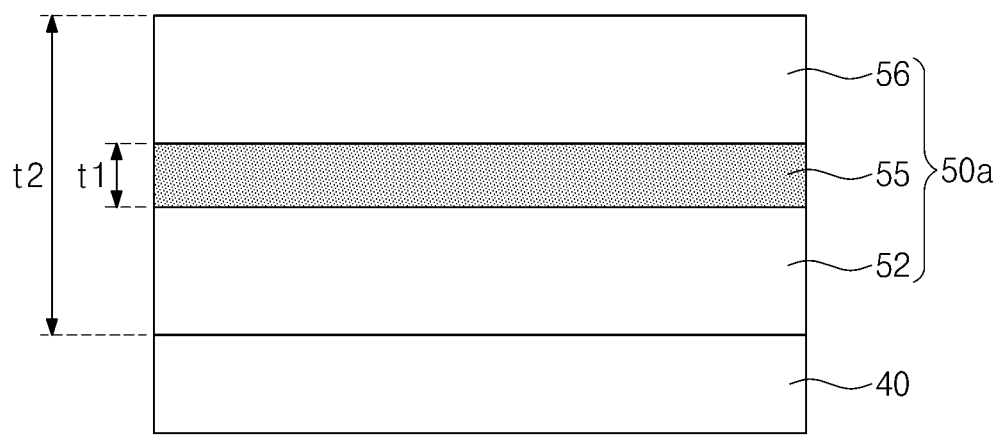
FIG. 7C is an enlarged view corresponding to a portion 'A' of FIG. 7A.

Referring to FIGS. 3, 7A, and 7B, a first thermal treatment process may be performed on the substrate 10 (in S240). The first thermal treatment process may be performed at a temperature of about 100-500° C. for about 10-300 sec. As a result of the first thermal treatment process, at least a portion of amorphous portions of the first and second metal oxide layers 52 and 56 may be crystallized. In addition, the remnant ion sources Ioa1 and Ioa2 may react with the metal layer 54 to form sub oxide layers. For example, the sub oxide layers may include a first sub oxide 55a adjacent to the first metal oxide layer 52 and a second sub oxide 55b adjacent to the second metal oxide layer 56. A part of the remnant ion source Ioa1 may be thermally diffused toward the metal layer 54, and the first sub oxide 55a may be formed by a reaction between the thermally diffused part of the remnant ion source Ioa1 and the metal layer 54. The second sub oxide 55b may be formed by a reaction between the remnant ion source Ioa2 and the metal layer 54 adjacent thereto. Because the metal layer 54 is formed of a metal material with high oxygen affinity, the metal layer 54 may easily react with the remnant ion sources Ioa1 and Ioa2 in the first thermal treatment process, thereby forming a metal oxide material. In other words, the metal layer 54 may serve as an absorption layer the remnant ion sources Ioa1 and Ioa2. By contrast, an unreacted part of the metal layer 54 that does not participate in the first thermal treatment process may be referred to as a remnant metal layer 55c. The remnant metal layer 55c may be interposed between the first sub oxide 55a and the second sub oxide 55b. Hereinafter, the first and second sub oxide layers 55a and 55b, and the remnant metal layer 55c provided therebetween, may be defined as an intervening layer 55. The first and second metal oxide layers 52 and 56, and the intervening layer 55 therebetween, may be defined as the tunnel barrier layer 50a. The remnant metal layer 55c may have a thickness that is smaller than the first thickness t1 of the intervening layer 55.

In the case where the first and second metal oxide layers 54 and 56, and the metal layer 54 contain the same metallic element (e.g., Mg), the first and second metal oxide layers 54 and 56, and the first and second sub oxide layers 55a and 55b may be or contain substantially the same metal oxide (e.g., MgO). In the case where the first and second metal oxide layers 54 and 56, and the metal layer 54 contain different metallic elements (for example, the first and second metal oxide layers 54 and 56 contain magnesium (Mg) and the metal layer 54 contains one of Fe, Ti, Ta, Al, W, Hf, or V), the first and second metal oxide layers 54 and 56 and the first and second sub oxide layers 55a and 55b may be metal oxide materials different from each other. In any case, the first and second sub oxide layers 55a and 55b may have an oxygen atom concentration (i.e., atm %) that is smaller than those of the first and second metal oxide layers 54 and 56.

In example embodiments, the entire portion of the metal layer 54 may be oxidized during the first thermal treatment process. For example, in the case where the first thickness t1 of the metal layer 54 is small, the metal layer 54 may be wholly oxidized by the first thermal treatment process. In this case, the intervening layer 55 may be a single sub oxide layer, as shown in FIG. 7C. That is, the first and second sub oxide layers 55a and 55b of FIG. 7B may be connected to each other to form a single layer serving as the intervening layer 55 of FIG. 7C. Even in this case, the intervening layer 55 may have an oxygen atom concentration that is smaller than those of the first and second metal oxide layers 54 and 56.

Figure 8:
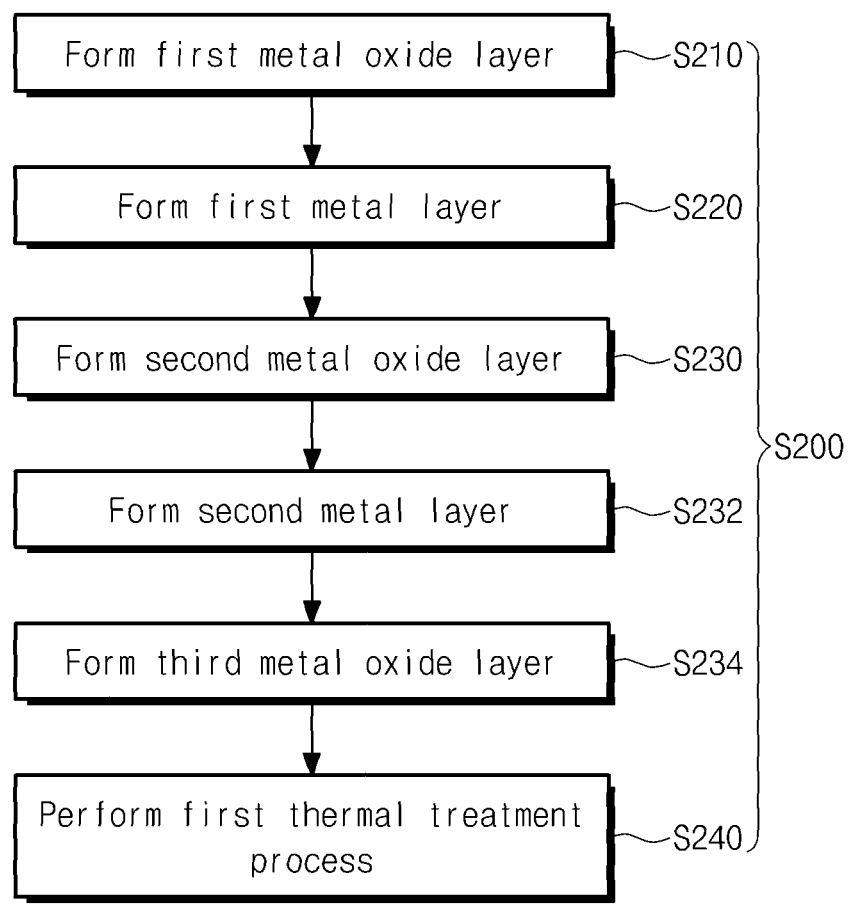
FIG. 8 is a flow chart illustrating a method of forming a tunnel barrier layer according to one or more example embodiments.
Figure 9:
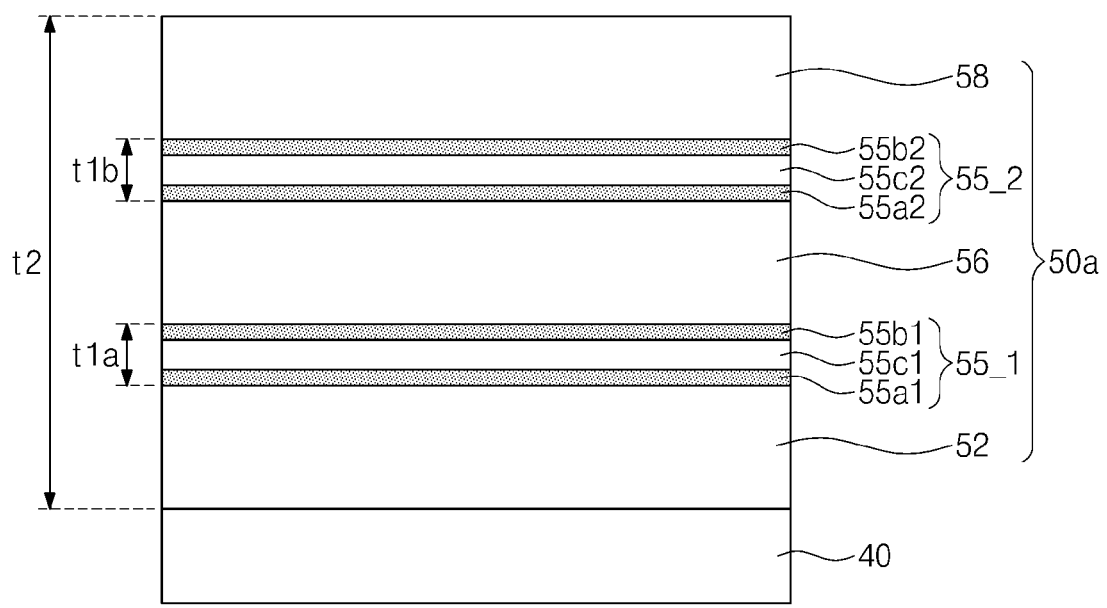
FIG. 9 is an enlarged view corresponding to a portion 'A' of FIG. 7A.

According to one or more example embodiments, a process S200 of forming the tunnel barrier layer 50a may include performing a process of forming a metal layer several times. For example, the tunnel barrier layer 50a may be formed to have at least two intervening layers. An example thereof will be described with reference to FIGS. 8 and 9. FIG. 8 is a flow chart illustrating a method of forming a tunnel barrier layer according to one or more example embodiments. FIG. 9 is an enlarged view corresponding to a portion 'A' of FIG. 7A.

Referring to FIG. 8, a process of forming the tunnel barrier layer 50a may include steps of forming a first metal oxide layer (in S210), forming a first metal layer (in S220), forming a second metal oxide layer (in S230), forming a second metal layer (in S232), forming a third metal oxide layer (in S234), and performing a first thermal treatment process (in S240). The steps S210, S220, and S230 of FIG. 8 may be performed in substantially the same or similar manner as the steps S210, S220, and S230 of FIG. 3. The step S232 of forming the second metal layer may be performed in substantially the same or similar manner as the step S220 of forming the first metal layer. Similarly, the step S234 of forming the third metal oxide layer may be performed in substantially the same or similar manner as the step S210 or S230 of forming the first metal oxide layer or the second metal oxide layer. Accordingly, as shown in FIG. 9, the tunnel barrier layer 50a may include first to third metal oxide layers 52, 56, and 58 and first and second intervening layers 55_1 and 55_2, which are respectively interposed between adjacent pairs of the metal oxide layers 52, 56, and 58. The first intervening layer 55_1 may include a pair of sub oxide layers 55a1 and 55b1, and a remnant metal layer 55c1 provided therebetween. The second intervening layer 55_2 may include a pair of sub oxide layers 55a2 and 55b2, and a remnant metal layer 55c2 provided therebetween. However, example embodiments are not limited thereto. Each of the first and second intervening layers 55_1 and 55_2 may constitute a single sub oxide layer, as shown in FIG. 7C. In any case, a sum of a thickness t1a of the first intervening layer 55_1 and a thickness t1b of the second intervening layer 55_2 may range from 0.1 to 0.2 times the second thickness t2 of the tunnel barrier layer 50a. Furthermore, each of the first and second intervening layers 55a and 55b may have an oxygen atom concentration that is smaller than those of the first to third metal oxide layers 52, 56, and 58. Although, in the present example embodiment, the process of forming a metal layer is performed twice, example embodiments are not be limited thereto. In example embodiments, the process of forming the tunnel barrier layer may include performing the process of forming a metal layer at least three times.

Figure 10:
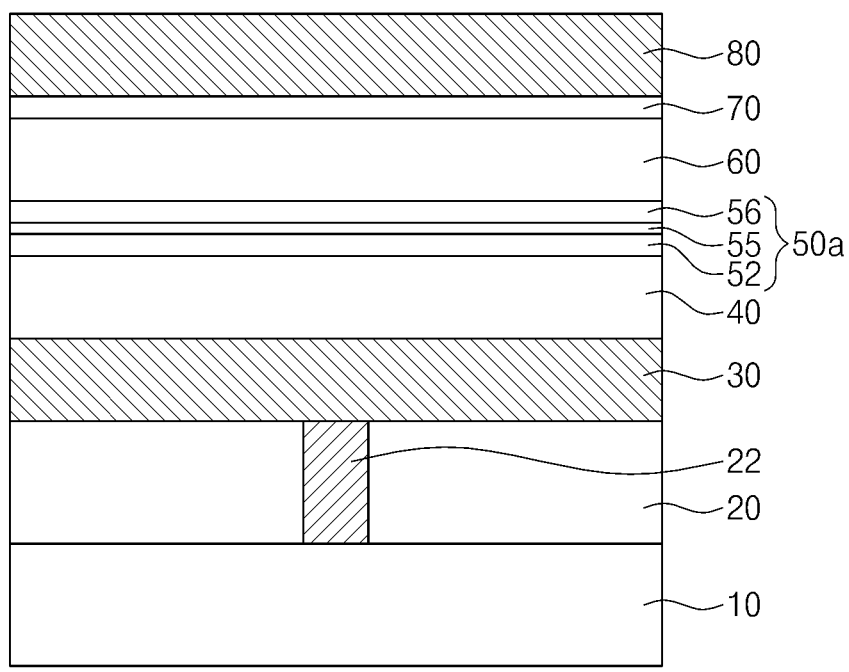
FIG. 10 is a sectional view illustrating a memory device according to one or more example embodiments.

Referring to FIGS. 3 and 10, a second magnetic layer 60 may be formed on the tunnel barrier layer 50a (in S300). The second magnetic layer 60 may be a fixed layer with a fixed magnetization direction or a free layer with a switchable magnetization direction. One of the first and second magnetic layers 40 and 60 may be used as the fixed layer with a fixed magnetization direction, and the other may be used as the free layer whose magnetization direction can be changed to be parallel or antiparallel to that of the fixed layer.

In one or more example embodiments, the second magnetic layer 60 may be formed to have a magnetization direction that is substantially perpendicular to the interface between the tunnel barrier layer 50a and the second magnetic layer 60. In this case, the second magnetic layer 60 may include at least one perpendicular magnetic materials (e.g., CoFeTb, CoFeGd, and CoFeDy), $L1_0$ perpendicular magnetic materials, hexagonal-close-packed (HCP) CoPt-based materials, or perpendicular magnetic structures. The $L1_0$ perpendicular magnetic material may include at least one of $L1_0$ FePt, $L1_0$ FePd, $L1_0$ CoPd, or $L1_0$ CoPt. The perpendicular magnetic structures may include magnetic layers and non-magnetic layers that are alternatingly and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n or (CoCr/Pd)n, where n is the number of stacked pairs of the layers.

In example embodiments, the second magnetic layer 60 may be formed to have a magnetization direction that is substantially parallel to the interface between the tunnel barrier layer 50a and the second magnetic layer 60. In this case, the second magnetic layer 60 may be formed of, or include a ferromagnetic material. In the case where the second magnetic layer 60 is a fixed layer, the second magnetic layer 60 may further include an anti-ferromagnetic material for fixing the magnetization direction of the ferromagnetic material.

The second magnetic layer 60 may be formed by a physical vapor deposition process or a chemical vapor deposition process. Hereinafter, for the sake of brevity, the description that follows will refer to an example in which the first magnetic layer 40 is the fixed layer and the second magnetic layer 60 is the free layer.

Next, a second thermal treatment process may be performed (in S400). The second thermal treatment process may be performed at a temperature of 350° C.-400° C. The second thermal treatment process may be performed for a longer time than the first thermal treatment process. For example, the second thermal treatment process may be performed for 30-120 minutes. As a result of the second thermal treatment process, the first and second magnetic layers 40 and 60 may be crystallized. According to one or more example embodiments, because the metal oxide layers 52 and 56 of the tunnel barrier layer 50a are crystallized in advance by the first thermal treatment process, it is possible to realize an effective lattice matching at interfaces between the tunnel barrier layer 50a and the magnetic layers 40 and 60 during the second thermal treatment process. This may make it possible to increase the magnetoresistance ratio TMR of the magnetic tunnel junction, without an increase in resistive area RA of the magnetic tunnel junction.

Thereafter, a capping oxide layer 70 may be formed on the second magnetic layer 60. The capping oxide layer 70 may be formed to allow the second magnetic layer 60 to have a magnetization direction perpendicular to the substrate 10. Accordingly, the second magnetic layer 60 may have an interface perpendicular magnetic anisotropy (IPMA). The capping oxide layer 70 may be formed of, or include at least one of tantalum oxide, magnesium oxide, titanium oxide, zirconium oxide, hafnium oxide, or zinc oxide. The capping oxide layer 70 may be formed before the second thermal treatment process. In example embodiments, the capping oxide layer 70 may be omitted.

A top electrode layer 80 may be formed on the capping oxide layer 70. The top electrode layer 80 may be formed of, or include at least one of tungsten, titanium, tantalum, aluminum, or metal nitrides (e.g., titanium nitride and tantalum nitride). The top electrode layer 80 may be formed by a sputtering process, a chemical vapor deposition process, or an atomic layer deposition process.

Figure 11A:
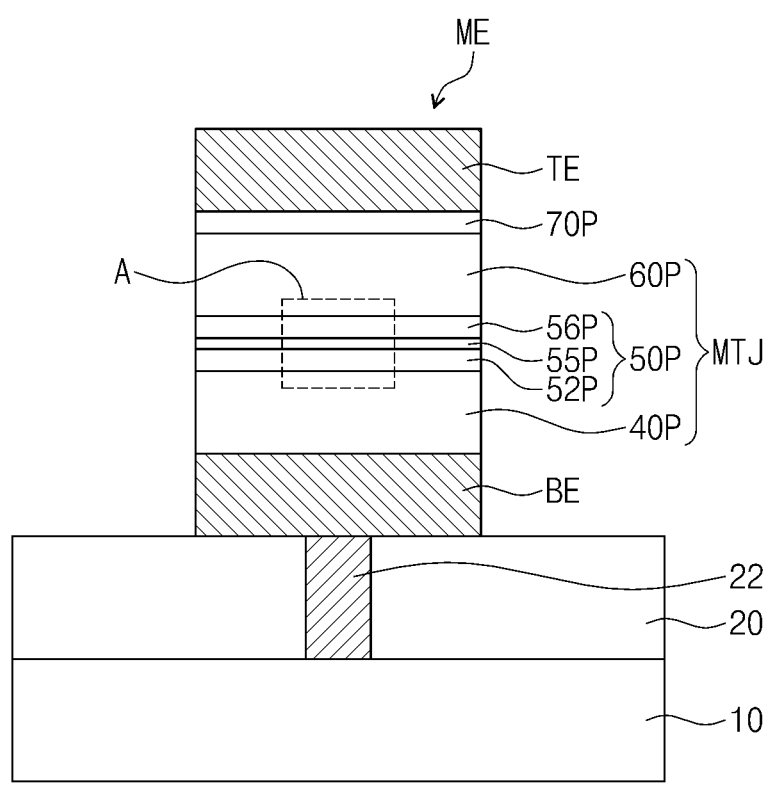
FIG. 11A is a sectional view illustrating a memory device according to one or more example embodiments.
Figure 11B:
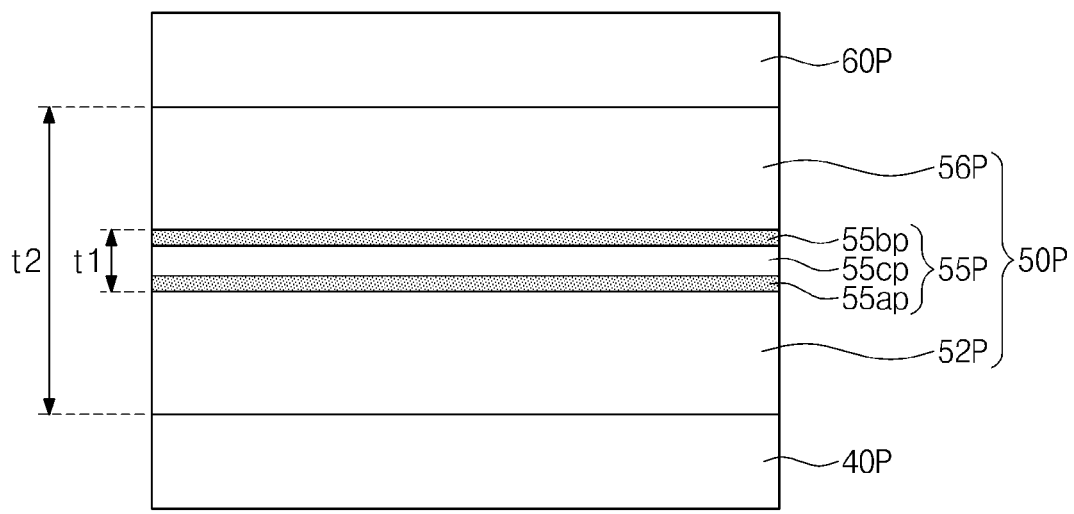
FIG. 11B is an enlarged view corresponding to portion 'A' of FIG. 11A.
Figure 11C:
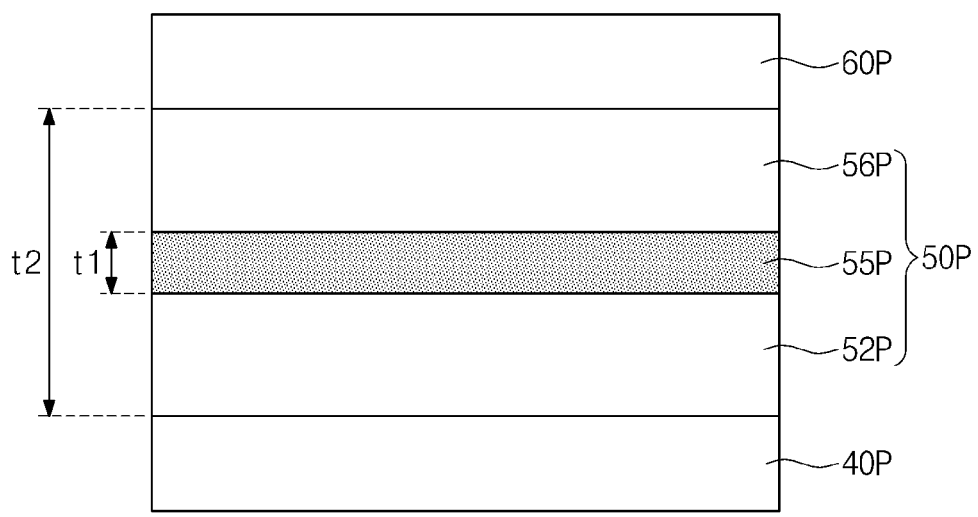
FIGS. 11C and 11D are enlarged views corresponding to a portion 'A' of FIG. 11A.
Figure 11D:
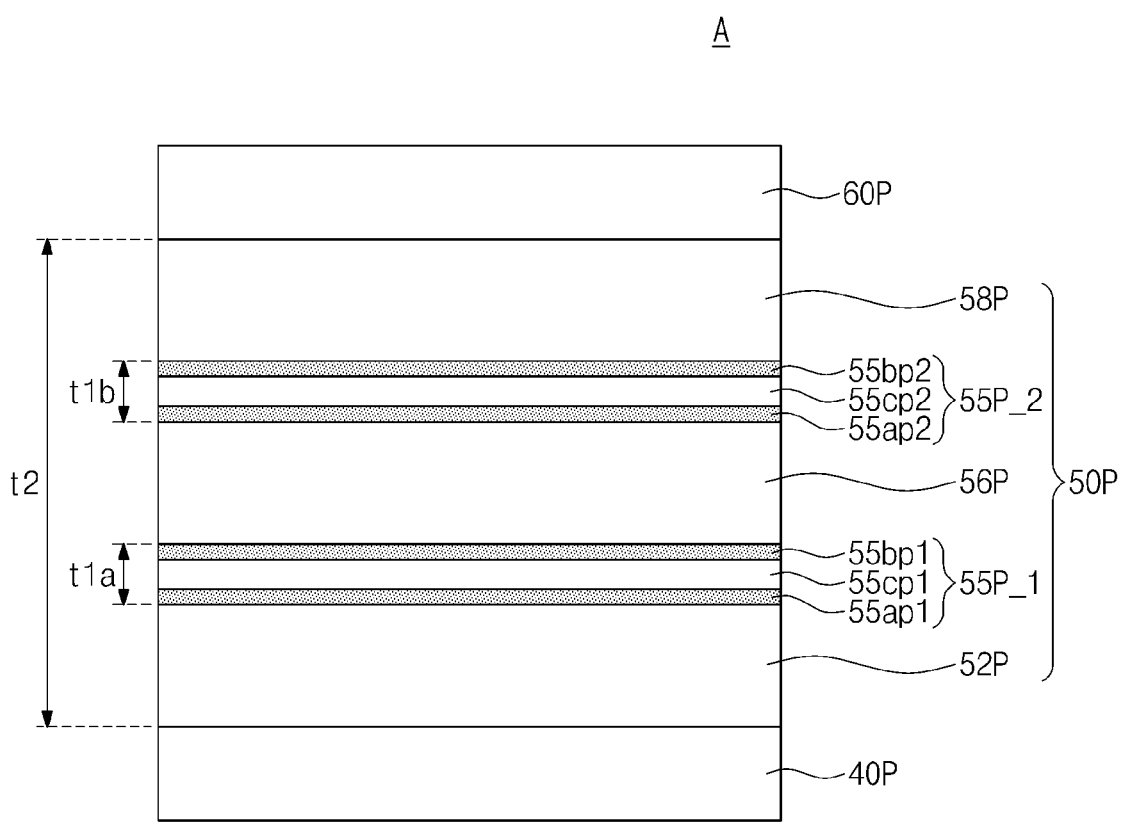
Figure 12A:
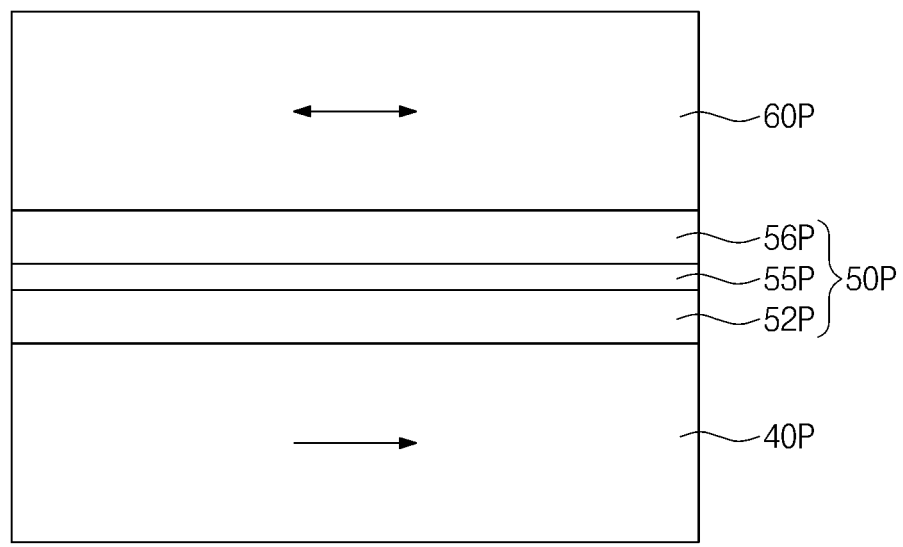
FIGS. 12A and 12B are conceptual diagrams illustrating a magnetic tunnel junction according to one or more example embodiments.
Figure 12B:
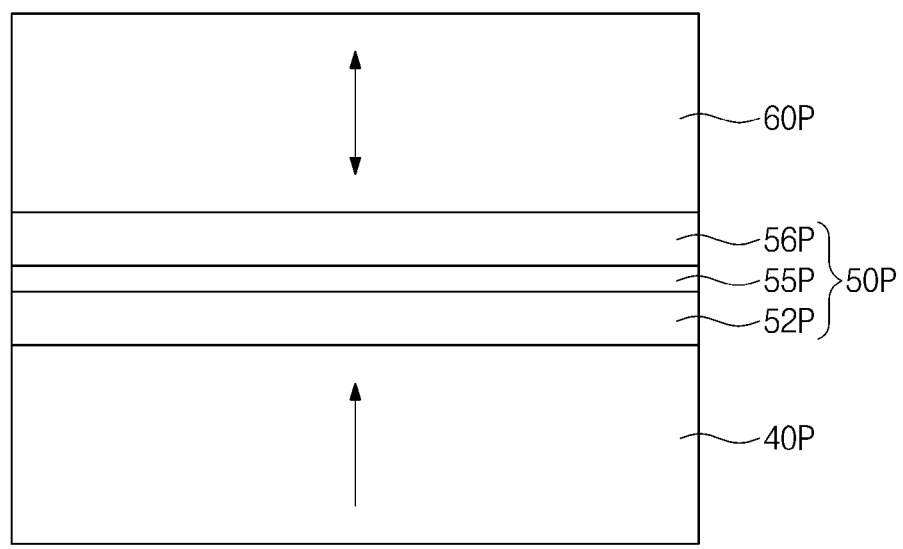

Referring to FIGS. 3, 11A, and 11B, the second magnetic layer 60, the tunnel barrier layer 50a, and the first magnetic layer 40 may be sequentially patterned to form the magnetic tunnel junction MTJ (in S500). For example, the top electrode layer 80 may be patterned to form a top electrode TE. The top electrode TE may be formed to define a region for the magnetic tunnel junction MTJ. The capping oxide layer 70, the second magnetic layer 60, the tunnel barrier layer 50a, the first magnetic layer 40, and the bottom electrode layer 30 may be sequentially etched using the top electrode TE as an etch mask, and as a result, a capping oxide pattern 70P, a second magnetic pattern 60P, a tunnel barrier pattern 50P, a first magnetic pattern 40P, and a bottom electrode BE may be formed. The magnetic tunnel junction MTJ may include the first magnetic pattern 40P, the tunnel barrier pattern 50P, and the second magnetic pattern 60P sequentially stacked on the bottom electrode BE.

In one or more example embodiments, as shown in FIG. 12A, the first and second magnetic patterns 40P and 60P may have in-plane magnetization directions that are substantially parallel to a surface at which the tunnel barrier pattern 50P and the second magnetic pattern 60P are in contact with each other. Although, in FIG. 12A, the first and second magnetic patterns 40P and 60P are illustrated as fixed and free layers, respectively, example embodiments are not limited thereto. According to example embodiments, the first magnetic pattern 40P may be used as a free layer, and the second magnetic pattern 60P may be used as a fixed layer.

Each of the first and second magnetic patterns 40P and 60P having the in-plane magnetization directions may include a ferromagnetic material. The first magnetic pattern 40P may further include an anti-ferromagnetic material for fixing the magnetization direction of the ferromagnetic material in the first magnetic pattern 40P.

In example embodiments, as shown in FIG. 12B, the first and second magnetic patterns 40P and 60P may have magnetization directions that are substantially perpendicular to an interface at which the tunnel barrier pattern 50P and the second magnetic pattern 60P are in contact with each other.

Each of the first and second magnetic patterns 40P and 60P having the perpendicular magnetization directions may include at least one perpendicular magnetic materials (e.g., CoFeTb, CoFeGd, and CoFeDy), $L1_0$ perpendicular magnetic materials, hexagonal-close-packed (HCP) CoPt-based materials, or perpendicular magnetic structures. The $L1_0$ perpendicular magnetic material may include at least one of $L1_0$ FePt, $L1_0$ FePd, $L1_0$ CoPd, or $L1_0$ CoPt. The perpendicular magnetic structures may include magnetic layers and non-magnetic layers that are alternatingly and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n or (CoCr/Pd)n, where n is the number of stacked pairs of the layers.

According to one or more example embodiments, the tunnel barrier pattern 50P may include a first metal oxide pattern 52P, an intervening pattern 55P, and a second metal oxide pattern 56P sequentially stacked on the first magnetic pattern 40P. The intervening pattern 55P may include a pair of sub oxide patterns 55ap and 55bp and an intervening pattern 55cp provided therebetween, as shown in FIG. 11B. The first thickness t1 of the intervening pattern 55P may range from 0.1 to 0.2 times the second thickness t2 of the tunnel barrier pattern 50P. In other words, the thickness ratio of t1/t2 may range from 0.1 to 0.2. For example, the second thickness t2 of the tunnel barrier pattern 50P may range from about 10 Å to about 15 Å, and the first thickness t1 of the intervening pattern 55P may range from about 1 Å to about 3 Å. Here, the first thickness t1 may be defined as a mean vertical distance from an interface between the first metal oxide pattern 52P and the intervening pattern 55P to an interface between the intervening pattern 55P and the second metal oxide pattern 56P. The second thickness t2 may be defined as a mean vertical distance from the interface between the first magnetic pattern 40P and the first metal oxide pattern 52P to the interface between the second metal oxide pattern 56P and the second magnetic pattern 60P.

In one or more example embodiments, the first and second metal oxide patterns 52P and 56P and the first and second sub oxide patterns 55ap and 55bp may contain substantially the same metal oxide material (e.g., MgO). In example embodiments, the first and second metal oxide patterns 52P and 56P and the first and second sub oxide patterns 55ap and 55bp may contain metal oxide materials different from each other. For example, the first and second metal oxide patterns 52P and 56P may contain MgO, and the first and second sub oxide patterns 55ap and 55bp may contain at least one of oxides of Fe, Ti, Ta, Al, W, Hf, or V. In any case, the first and second sub oxide patterns 55ap and 55bp may have an oxygen atom concentration (i.e., atm %) that is smaller than those of the first and second metal oxide patterns 52P and 56P. The intervening pattern 55P may be formed to have a single sub oxide pattern, as shown in FIG. 11C. This structure may be obtained when the tunnel barrier layer 50a is formed by the method described with reference to FIG. 7C. The first thickness t1 and the oxygen atom concentration of the intervening pattern 55P may be substantially the same as those described with reference to FIG. 11B. In other words, the first thickness t1 of the intervening pattern 55P may range from 0.1 to 0.2 times the second thickness t2 of the tunnel barrier pattern 50P, and the oxygen atom concentration in of the intervening pattern 55P may be smaller than those of the first and second metal oxide patterns 52P and 56P.

In example embodiments, the tunnel barrier pattern 50P may include a plurality of intervening patterns. As an example, the tunnel barrier pattern 50P may include metal oxide patterns 52P, 56P, and 58P and intervening patterns 55ap and 55bp, which are respectively interposed between adjacent pairs thereof, as shown in FIG. 11D. In other words, the tunnel barrier pattern 50P may include the first metal oxide pattern 52P, a first intervening pattern 55P_1, a second metal oxide pattern 56P, a second intervening pattern 55P_2, and a third metal oxide pattern 58P sequentially stacked on the first magnetic pattern 40P. This structure may be obtained when the tunnel barrier layer 50a is formed by the method described with reference to FIGS. 8 and 9. The first intervening pattern 55P_1 may include a pair of the sub oxide patterns 55ap1 and 55bp1 and a remnant metal pattern 55cp1 therebetween. The second intervening pattern 55P_2 may include a pair of sub oxide patterns 55ap2 and 55bp2 and a remnant metal pattern 55cp2 therebetween. Here, a sum of the thickness t1a of the first intervening pattern 55P_1 and the thickness t1b of the second intervening pattern 55P_2 may range from 0.1 to 0.2 times the second thickness t2 of the tunnel barrier pattern 50P. In addition, the sub oxide patterns 55*ap*1, 55*bp*1, 55*ap*2, and 55*bp*2 may have oxygen atom concentrations that are smaller than those of the first to third metal oxide patterns 52P, 56P, and 58P. Each of the first and second intervening patterns 55P_1 and 55P_2 may be a single sub oxide pattern.

According to one or more example embodiments, the process of forming the tunnel barrier layer may be performed to form a tunnel barrier pattern including at least two metal oxide patterns and an intervening pattern interposed therebetween. During the formation of the tunnel barrier pattern, the intervening pattern between the metal oxide patterns may prevent remnant ion sources (e.g., oxygen ions and/or oxygen radicals) from excessively accumulating at a region adjacent to the interface between the first magnetic pattern and the tunnel barrier pattern. Furthermore, the intervening pattern may contribute to reduce a band gap energy of the tunnel barrier pattern. For example, in the case where the tunnel barrier pattern is formed to have a structure of MgO/Mg/MgO, it may have a band gap energy of about 1.0 eV that is lower than a band gap energy (e.g., of about 1.3 eV) of the single magnesium oxide (MgO) layer. The low band gap energy of the tunnel barrier pattern may make it possible to increase a magnetoresistance ratio (TMR) of a magnetic tunnel junction. That is, according to one or more example embodiments, it is possible to realize a magnetic tunnel junction with increased magnetoresistance ratio (TMR), without an increase of resistive area (RA), and consequently, to realize a magnetic memory device with improved characteristics.

Figure 13:
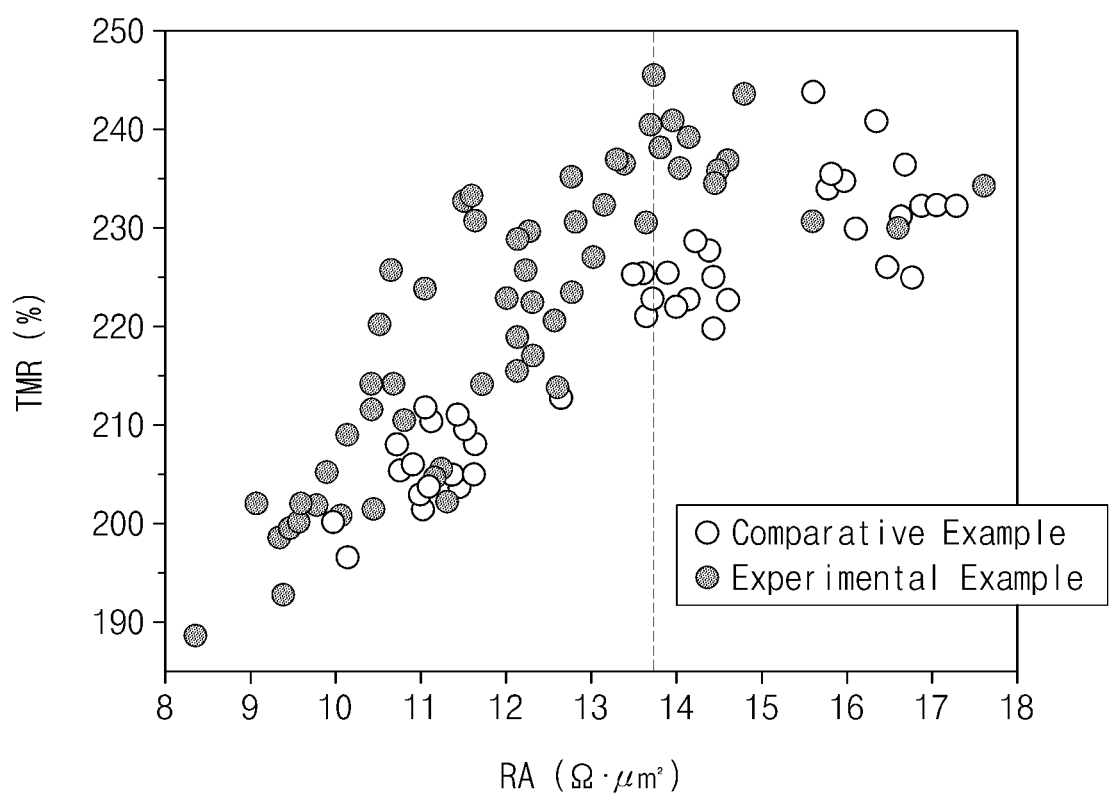
FIG. 13 is a graph showing a change in magnetoresistance ratio (TMR) caused by a variation in resistive area (RA) according to an experimental example and a comparative example.
Figure 14:
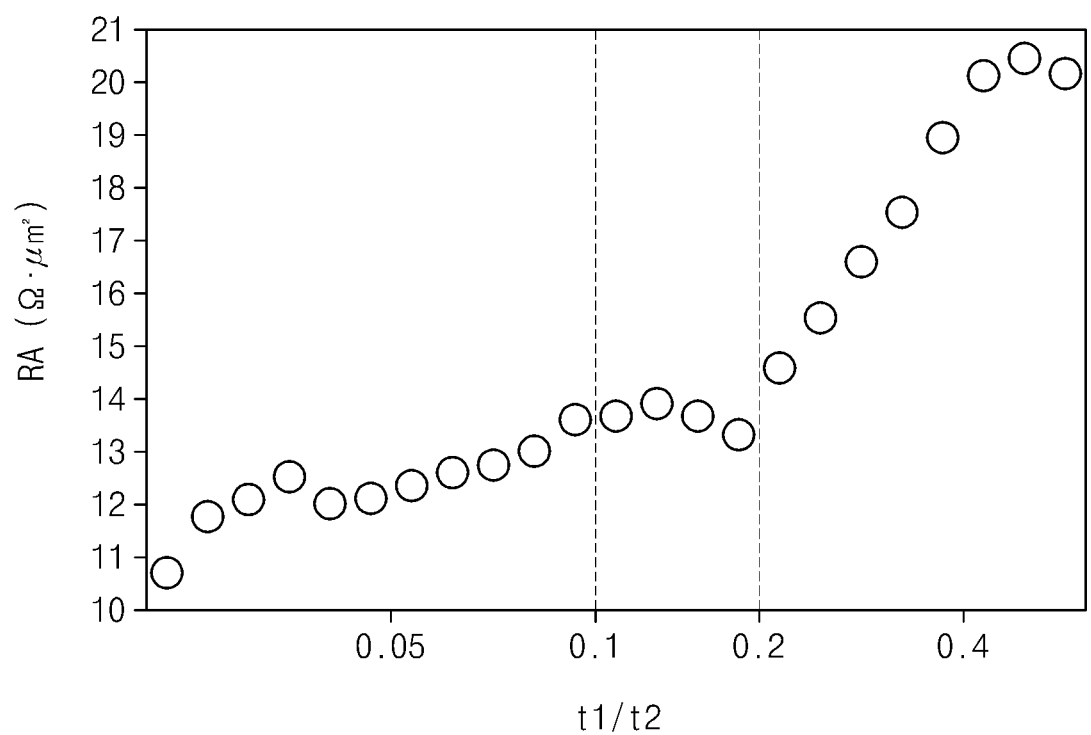
FIGS. 14 and 15 are graphs showing a resistive area RA and a magnetoresistance ratio TMR, respectively, according to a ratio of a thickness t1 of a magnesium layer to a thickness t2 of a tunnel barrier layer formed by the experimental example of FIG. 13.
Figure 15:
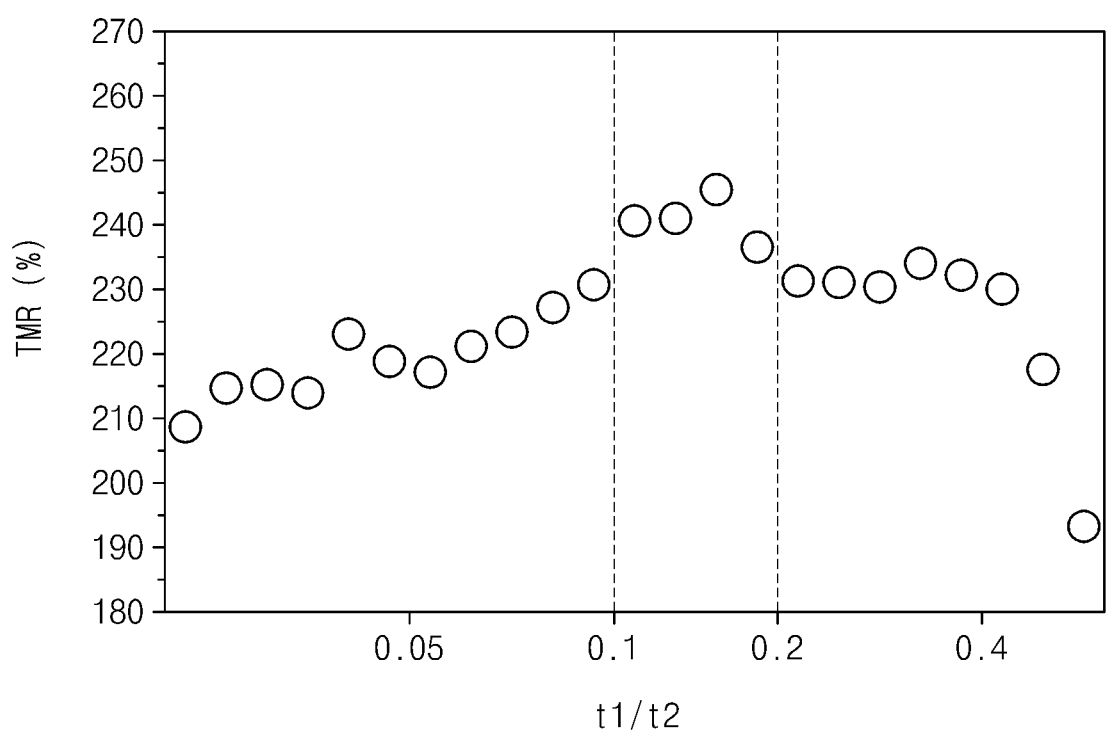

FIGS. 13, 14, and 15 are graphs illustrating electric characteristics of a magnetic tunnel junction according to one or more example embodiments. In detail, FIG. 13 is a graph showing a change in magnetoresistance ratio (TMR) caused by a variation in resistive area (RA) according to an experimental example of an example embodiment and a comparative example. In the experimental example, a tunnel barrier layer was formed by sequentially depositing magnesium oxide/magnesium/magnesium oxide layers using the method described with reference to FIGS. 3, 5A, 5B, 6A, 6B, 7A, and 7B and then by performing an in situ thermal treatment process thereon, and in the comparative example, a tunnel barrier layer was formed by depositing a single magnesium oxide layer and then performing a thermal treatment process thereon. FIGS. 14 and 15 are graphs showing a resistive area RA and a magnetoresistance ratio TMR, respectively, according to a ratio of a thickness t1 of a magnesium layer to a thickness t2 of a tunnel barrier layer (i.e., a total thickness of the magnesium oxide/magnesium/magnesium oxide layers) formed by the experimental example of FIG. 13.

Referring to FIG. 13, at the resistive area RA of about 13.7 Ω·μm2, the magnetoresistance ratio TMR was about 220-225% in the comparative example and about 235-245% in the experimental example. In other words, at the same resistive area RA, the magnetoresistance ratio TMR in the experimental example was higher by about 15 to 20% than that in the comparative example. This shows that, according to the experimental example, it is possible to improve the magnetoresistance ratio (TMR) property of the magnetic tunnel junction.

Referring to FIGS. 14 and 15, when the thickness ratio of t1/t2 is less than 0.1, the resistive area RA decreased, but the magnetoresistance ratio TMR also decreased. When the thickness ratio of t1/t2 is greater than 0.2, the resistive area RA abruptly increased and the magnetoresistance ratio TMR decreased. By contrast, when the thickness ratio of the thickness t1 of the metal layer (i.e., a magnesium layer) to the thickness t2 of the tunnel barrier layer was within a range from 0.1 to 0.2, the magnetoresistance ratio TMR increased, without any increase in the resistive area RA.

Figure 16:
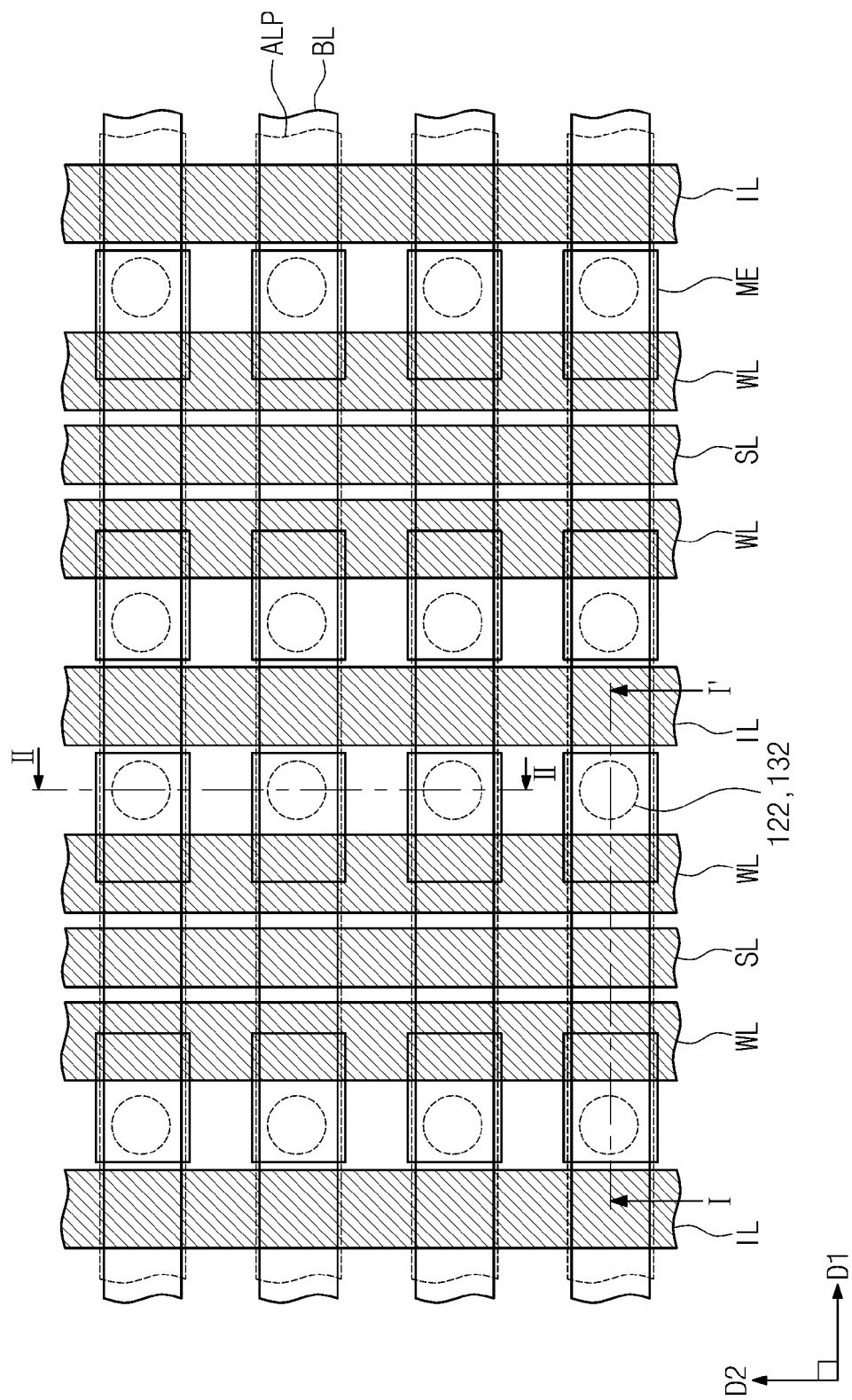
FIG. 16 is a plan view illustrating a magnetic memory device according to one or more example embodiments.
Figure 17:
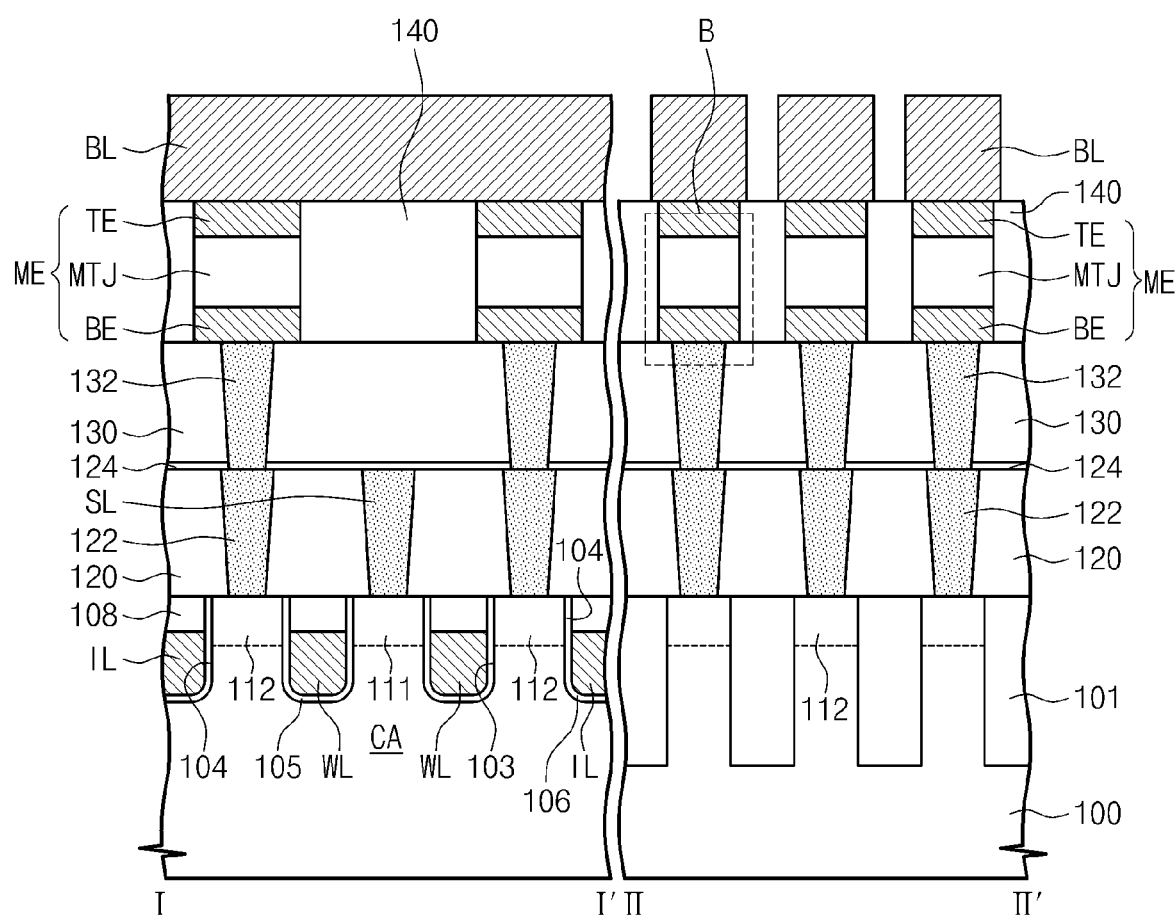
FIG. 17 is a sectional view taken along lines I-I' and II-II' of FIG. 16.
Figure 18A:
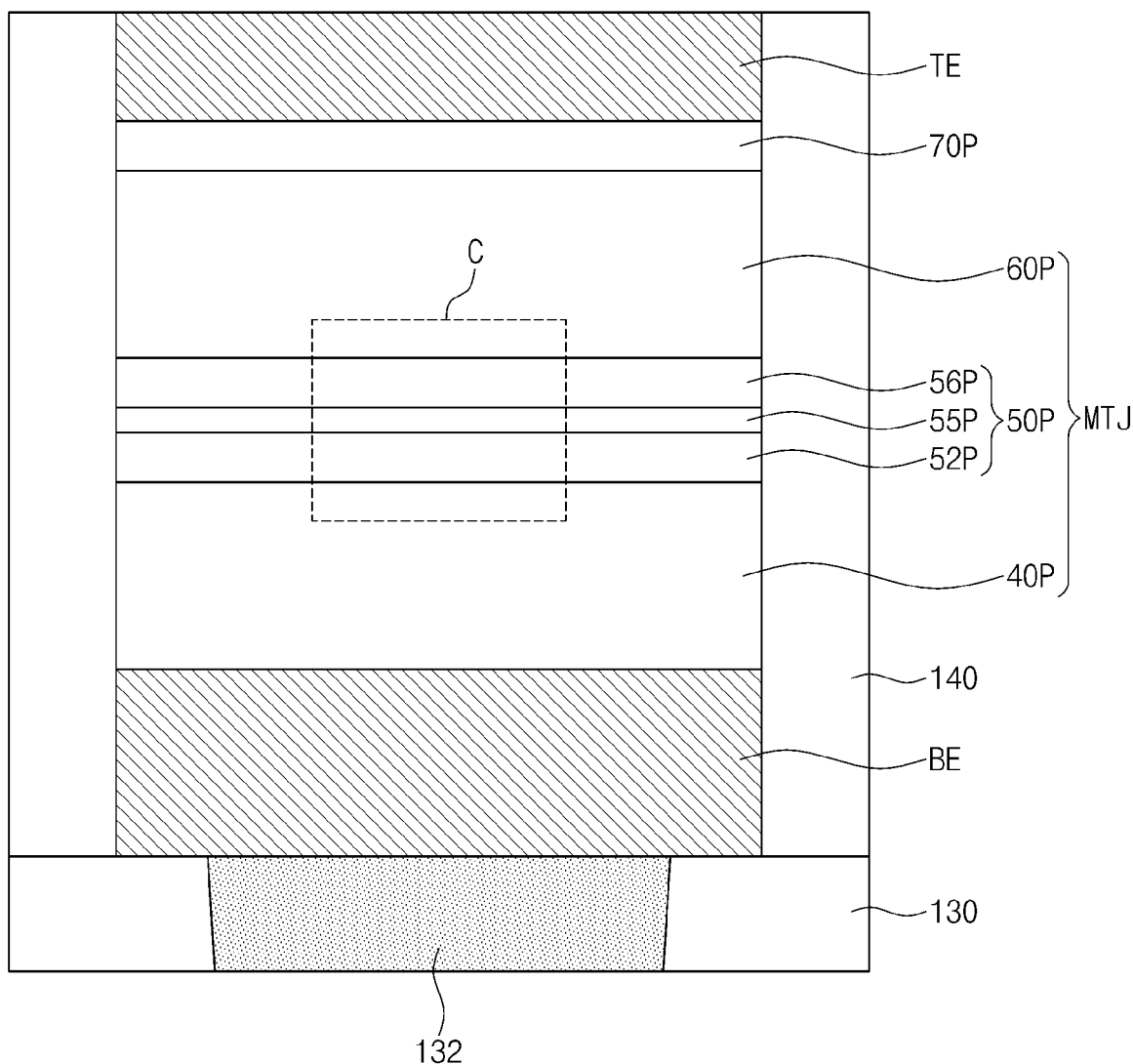
FIG. 18A is an enlarged view corresponding to a portion 'B' of FIG. 17.
Figure 18B:
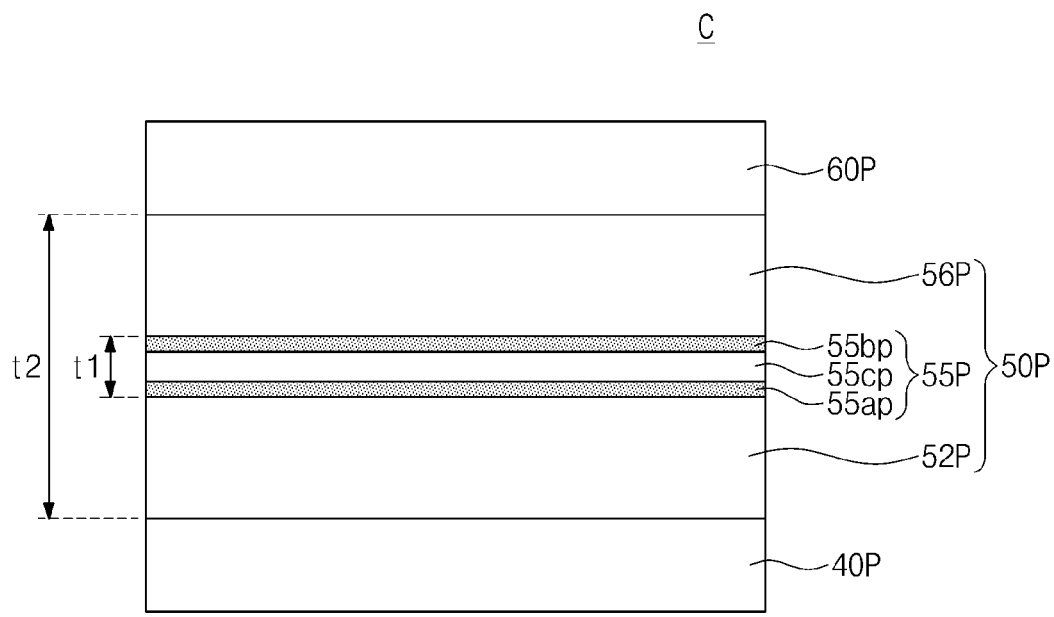
FIGS. 18B, 18C, and 18D are enlarged views corresponding to a portion 'C' of FIG. 18A.
Figure 18C:
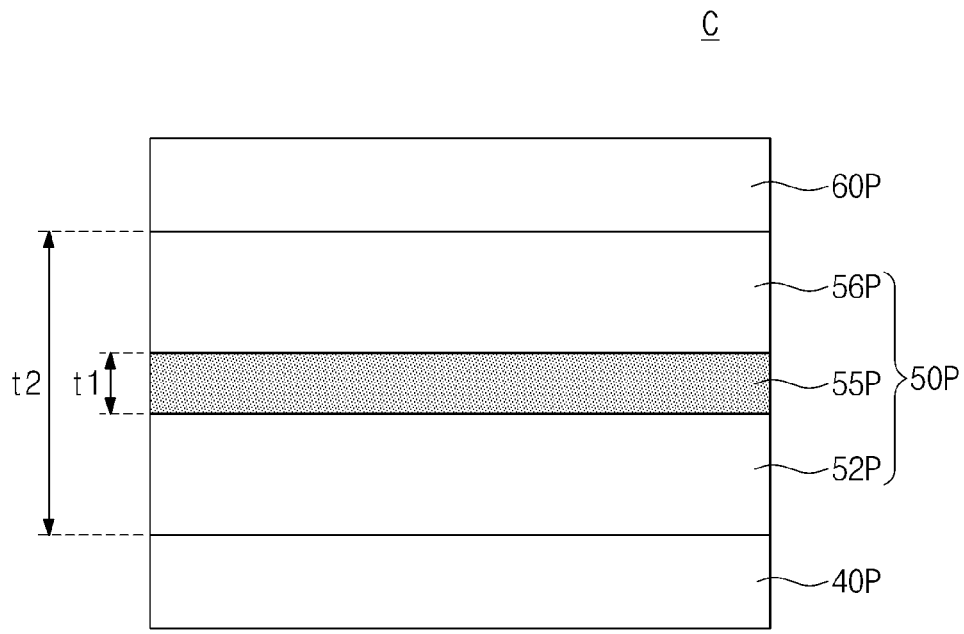
Figure 18D:
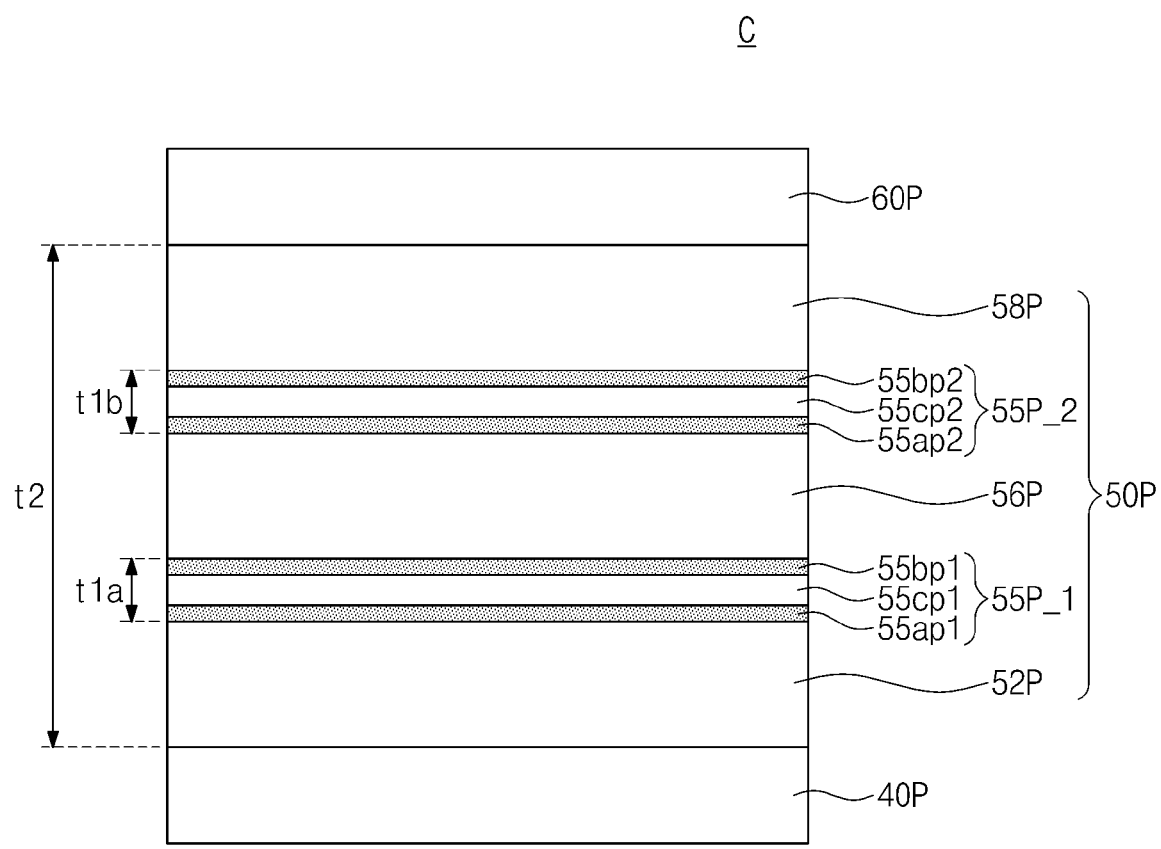

FIG. 16 is a plan view illustrating a magnetic memory device according to one or more example embodiments, and FIG. 17 is a sectional view taken along lines I-I' and II-II' of FIG. 16. FIG. 18A is an enlarged view corresponding to a portion 'B' of FIG. 17. FIGS. 18B, 18C, and 18D are enlarged views corresponding to a portion 'C' of FIG. 18A.

Referring to FIG. 17, a substrate 100 may be provided. The substrate 100 may be a silicon substrate, a germanium substrate, and/or a silicon-germanium substrate. The substrate 100 may be prepared to have a first conductivity type. Device isolation patterns 101 may be formed on the substrate 100. As shown in FIGS. 16 and 17, device isolation patterns 101 may define active line patterns ALP. As shown in FIG. 16, when viewed in plan view, each of the active line patterns ALP may be a line-shaped pattern extending parallel to a first direction D1. The device isolation patterns 101 and the active line patterns ALP may be alternatingly arranged in a second direction D2 that is perpendicular to the first direction D1. In example embodiments, the active line patterns ALP may be doped to have the first conductivity type.

The substrate 100 may include isolation recess regions 104 that are provided to cross the active line patterns ALP and the device isolation patterns 101. When viewed in plan view, each of the isolation recess regions 104 may be shaped like a groove and may extend parallel to the second direction D2. The isolation recess regions 104 may be provided in such a way that each of the active line patterns ALP is sectioned into a plurality of active patterns CA. Each of the active patterns CA may be a portion of each active line pattern ALP between an adjacent pair of the isolation recess regions 104. In other words, each of the active patterns CA may be defined by an adjacent pair of the device isolation patterns 101 and an adjacent pair of the isolation recess regions 104. When viewed in plan view, the active patterns CA may be disposed spaced apart from each other in both of the first and second directions to form a matrix-shaped arrangement.

Gate recess regions 103 may be formed to cross the active patterns CA arranged along the second direction D2. Each of the gate recess regions 103 may be shaped like a groove and may extend parallel to the isolation recess regions 104. In example embodiments, a pair of the gate recess regions 103 may cross each of the active patterns CA. In this case, a pair of cell transistors may be formed on each of the active patterns CA.

The gate recess regions 103 may have substantially the same depth as the isolation recess regions 104. A width of each of the gate recess regions 103 may be substantially equal to or different from that of the isolation recess regions 104. The depth of the gate and isolation recess regions 103 and 104 may be smaller than depths of the device isolation patterns 101.

Word lines WL may be provided in the gate recess regions 103, respectively. A cell gate dielectric layer 105 may be provided between the word line WL and an inner surface of the gate recess region 103. Due to the shape of the gate recess region 103, the word line WL may be a line-shape structure extending parallel to the second direction D2. Each cell transistor may include the word line WL and a channel region, which has a recessed profile and faces the word line WL.

Isolation lines IL may be provided in the isolation recess regions 104, respectively. An isolation gate dielectric layer 106 may be provided between the isolation line IL and an inner surface of the isolation recess region 104. The isolation line IL may be a line-shape structure extending parallel to the second direction D2.

A gate mask pattern 108 may be provided on each of the word and isolation lines WL and IL. The word and isolation lines WL and IL may have top surfaces lower than the top entrances of the cell and isolation recess regions 103 and 104. The gate mask pattern 108 may be provided in an upper portion of each of the cell and isolation recess regions 103 and 104. The gate mask pattern 108 may have a top surface that is substantially coplanar with that of the substrate 100.

In operation of the magnetic memory device, an isolation voltage may be applied to the isolation lines IL. The isolation voltage may be selected to prevent a channel or inversion layer from being formed below the isolation recess regions 104. In other words, when the isolation lines IL are applied with the isolation voltage, isolation channel regions positioned below the isolation lines IL may be turned-off. Accordingly, the active patterns CA of each active line pattern ALP may be electrically separated from each other. For example, in the case where the active line patterns ALP are doped with p-type dopants, the isolation voltage may be a ground or negative voltage.

For example, the word line WL may be formed of, or include at least one of doped semiconductor materials (e.g., doped silicon), metals (e.g., tungsten, aluminum, titanium, or tantalum), conductive metal nitrides (e.g., titanium nitride, tantalum nitride, or tungsten nitride), or metal-semiconductor compounds (e.g., metal silicide). In example embodiments, the isolation line IL may be formed of the same material as the word line WL. The cell and isolation gate dielectric layers 105 and 106 may be formed of, or include, for example, silicon oxide, silicon nitride, silicon oxynitride, and/or high-k dielectric materials including insulating metal oxides (e.g., hafnium oxide or aluminum oxide). The gate mask pattern 108 may include, for example, silicon oxide, silicon nitride, and/or silicon oxynitride.

A first doped region 111 may be provided in each of the active patterns CA and between each adjacent pair of the word lines WL. Second doped regions 112 may be provided in the active patterns CA and between the word and isolation lines WL and IL. In example embodiments, the first doped region 111 may be provided in a central region of each of the active patterns CA, and a pair of the second doped regions 112 may be respectively provided in edge regions of each of the active patterns CA. Accordingly, the pair of cell transistors formed on each active pattern CA may share the first doped region 111. The first and second doped regions 111 and 112 may serve as source and drain regions of the cell transistor. The first and second doped regions 111 and 112 may be doped to have a second conductivity type different from the first conductivity type. One of the first and second conductivity types may be an n-type, and the other may be a p-type.

Furthermore, a first interlayered insulating layer 120 may be provided on the substrate 100. The first interlayered insulating layer 120 may be formed of, or include, for example, silicon oxide. The first interlayered insulating layer 120 may be formed to have source grooves, and source lines SL may be provided to fill the source grooves, respectively. The source lines SL may extend parallel to the second direction D2. Each source line SL may be formed of, or include at least one of doped semiconductor materials (e.g., doped silicon), metals (e.g., tungsten, aluminum, titanium, or tantalum), conductive metal nitrides (e.g., titanium nitride, tantalum nitride, or tungsten nitride), or metal-semiconductor compounds (e.g., metal silicide). Each source line SL may connect the first doped regions 111, which are arranged in the second direction D2, to each other. Furthermore, the first interlayered insulating layer 120 may be formed to have first contact holes, and first contact plugs 122 may be respectively provided in the first contact holes and may be respectively connected to the second doped regions 112. The first contact plugs 122 may be formed of the same conductive material as the source lines SL. The source lines SL and the first contact plugs 122 may have top surfaces that are substantially coplanar with that of the first interlayered insulating layer 120.

An etch stop layer 124 may be provided on the first interlayered insulating layer 120. The etch stop layer 124 may be formed to cover the top surfaces of the source lines SL. The etch stop layer 124 may be formed of an insulating material having an etch selectivity with respect to the first interlayered insulating layer 120. For example, the first interlayered insulating layer 120 may be formed of silicon oxide, and the etch stop layer 124 may be formed of silicon nitride and/or silicon oxynitride.

The second interlayered insulating layer 130 may be provided on the etch stop layer 124. The second interlayered insulating layer 130 may be formed of silicon oxide.

Second contact plugs 132 may be provided to penetrate both of the second interlayered insulating layer 130 and the etch stop layer 124. The second contact plugs 132 may be electrically connected to the second doped regions 112, respectively, via the first contact plugs 122. In example embodiments, ohmic patterns may be provided between the first and second contact plugs 122 and 132, between the first contact plugs 122 and the second doped regions 112, and between the source lines SL and the first doped regions 111. The ohmic pattern may be formed of, or include at least one of metal-semiconductor compounds including a metal silicide (e.g., cobalt silicide or titanium silicide).

A plurality of memory elements ME may be provided on the second interlayered insulating layer 130. Each of the memory elements ME may include the lower electrode BE, the magnetic tunnel junction MTJ, and the upper electrode TE. In detail, the magnetic tunnel junction MTJ may have the same structure as that of FIG. 18A. FIG. 18A is an enlarged view of a portion 'B' of FIG. 17 and corresponds to that of FIG. 11A. In other words, the magnetic tunnel junction MTJ may include the first magnetic pattern 40P, the tunnel barrier pattern 50P, and the second magnetic pattern 60P that are sequentially stacked on the bottom electrode BE. The tunnel barrier pattern 50P may include at least two metal oxide patterns and an intervening pattern interposed therebetween. For example, the tunnel barrier pattern 50P may have the same structure as that of FIG. 18B, 18C, or 18D. Because FIGS. 18B, 18C, and 18D correspond to those of FIGS. 11B, 11C, and 11D and the structures of the tunnel barrier pattern 50P were described with reference to FIGS. 11B, 11C, and 11D, a detail description thereof will be omitted.

As an example, each of the memory elements ME may be patterned to have an island-shaped structure. When viewed in a plan view, the memory elements ME may be overlapped with the second contact plugs 132, respectively.

In one or more example embodiments, the capping oxide pattern 70P may be interposed between the second magnetic pattern 60P and the top electrode TE. The capping oxide pattern 70P may be configured in such a way that the second magnetic pattern 60P has a magnetization direction perpendicular to the substrate 100. Accordingly, the second magnetic pattern 60P may have an interface perpendicular magnetic anisotropy (IPMA). The capping oxide pattern 70P may include at least one of tantalum oxide, magnesium oxide, titanium oxide, zirconium oxide, hafnium oxide, or zinc oxide. In example embodiments, the capping oxide pattern 7P0 may be omitted.

A third interlayered insulating layer 140 may be formed on the second interlayered insulating layer 130 to be in contact with sidewalls of the memory elements ME. The third interlayered insulating layer 140 may be formed to expose the top surfaces of the memory elements ME.

Bit lines BL may be provided on the third interlayered insulating layer 140. The bit lines BL may extend in the first direction D1. Each of the bit lines BL may be in common contact with a plurality of the memory elements ME arranged in the first direction D1. For example, the bit line BL may be connected to the memory elements ME without any contact plug interposed therebetween. This makes it possible to simplify the fabrication process and reduce contact resistance between the bit line BL and the memory elements ME. Furthermore, it is possible to improve uniformity in contact resistance between the bit line BL and the memory elements ME.

FIGS. 19 to 22 are sectional views, which correspond to lines I-I' and II-II' of FIG. 16 and illustrate a method of fabricating a magnetic memory device according to one or more example embodiments.

Figure 19:
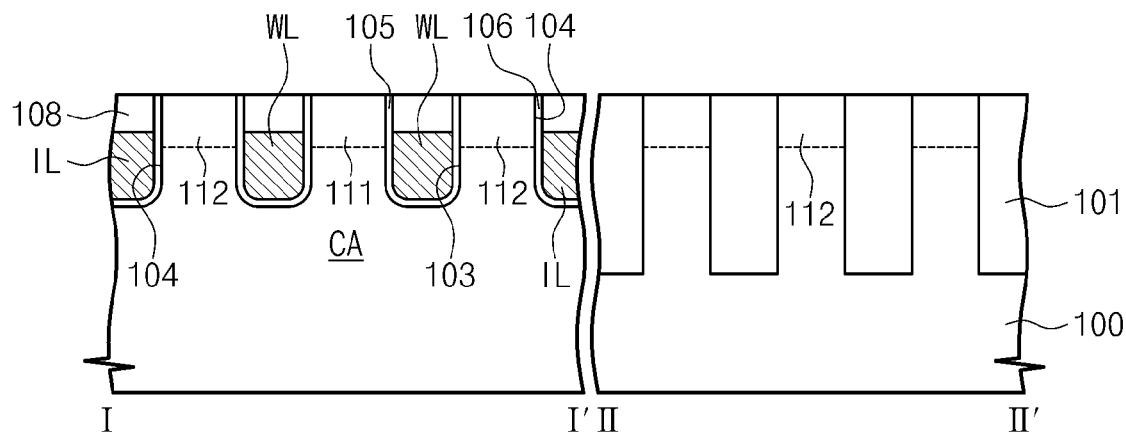
FIGS. 19 to 22 are sectional views, which correspond to lines I-I' and II-II' of FIG. 16 and illustrate a method of fabricating a magnetic memory device according to one or more example embodiments.

Referring to FIGS. 16 and 19, the substrate 100 may be provided. The substrate 100 may be a silicon substrate, a germanium substrate, and/or a silicon-germanium substrate. The substrate 100 may have the first conductivity type.

The device isolation patterns 101 may be formed on the substrate 100 to define the active line patterns ALP. The active line patterns ALP may be formed to be parallel to the first direction D1 of FIG. 16. The device isolation patterns 101 may be formed using a shallow trench isolation (STI) process.

The active line patterns ALP and the device isolation patterns 101 may be patterned to form the gate and isolation recess regions 103 and 104 extending parallel to the second direction D2 of FIG. 16. The isolation recess regions 104 may be formed to section each active line pattern ALP into a plurality of active patterns CA. The gate recess regions 103 may cross the cell active patterns CA. The gate and isolation recess regions 103 and 104 may be formed to have depths that are smaller than those of the device isolation patterns 101.

The cell gate dielectric layer 105 may be formed to conformally cover an inner surface of each gate recess region 103. The isolation gate dielectric layer 106 may also be formed to conformally cover an inner surface of each isolation recess region 104. In example embodiments, the cell and isolation gate dielectric layers 105 and 106 may be simultaneously formed using the same process. The cell and isolation gate dielectric layers 105 and 106 may be silicon oxide layers, which are formed by performing a thermal oxidation process on the substrate 100. Alternatively, the cell and isolation gate dielectric layers 105 and 106 may be formed of, or include at least one of silicon oxide, silicon nitride, silicon oxynitride, or high-k dielectric materials including insulating metal oxides (e.g., hafnium oxide or aluminum oxide).

Next, a first conductive layer may be formed to fill the gate and isolation recess regions 103 and 104. The first conductive layer may be formed of, or include at least one of doped semiconductor materials (e.g., doped silicon), metals (e.g., tungsten, aluminum, titanium, or tantalum), conductive metal nitrides (e.g., titanium nitride, tantalum nitride, or tungsten nitride), or metal-semiconductor compounds (e.g., metal silicide). The first conductive layer may be etched to form the word line WL in each gate recess region 103 and the isolation line IL in each isolation recess region 104. The word and isolation lines WL and IL may be recessed to have top surfaces that are lower than that of the substrate 100.

The gate mask patterns 108 may be formed on the word and isolation lines WL and IL to fill the gate and isolation recess regions 103 and 104 provided with the word and isolation lines WL and IL. The gate mask pattern 108 may be formed of, or include at least one of silicon oxide, silicon nitride, or silicon oxynitride.

Dopants may be injected into the cell active patterns CA between the word lines WL to form the first and second doped regions 111 and 112 with the second conductivity type. Bottom surfaces of the first and second doped regions 111 and 112 may be formed at a level higher than bottom levels of the word and isolation lines WL and IL.

Figure 20:
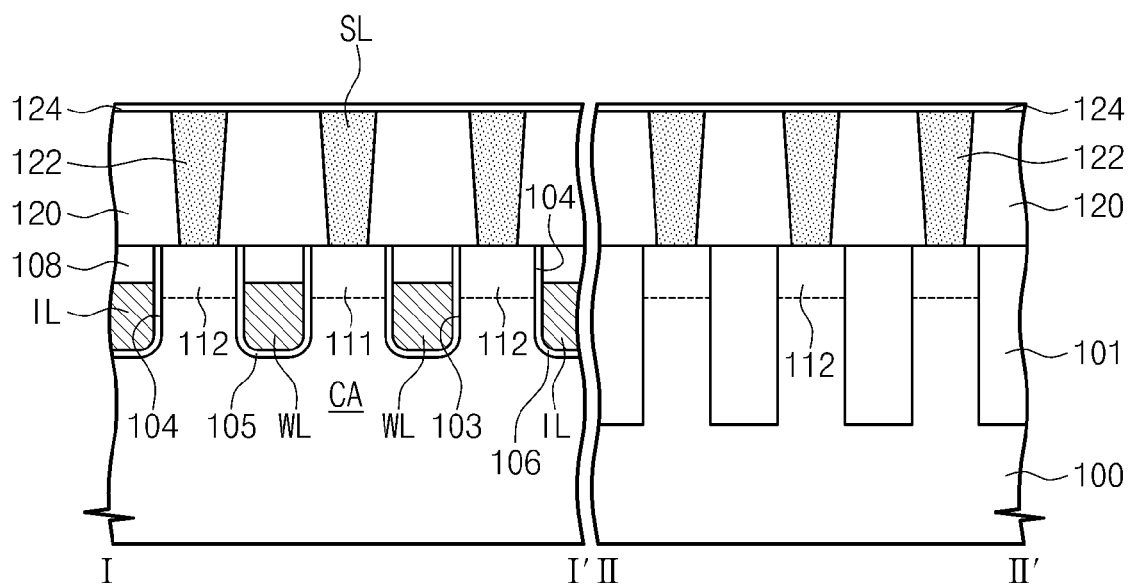

Referring to FIGS. 16 and 20, the first interlayered insulating layer 120 may be formed on the substrate 100. The first interlayered insulating layer 120 may be formed of silicon oxide. The first interlayered insulating layer 120 may be patterned to form cell holes and source grooves.

A second conductive layer may be formed to fill the cell holes and the source grooves. The second conductive layer may be formed of, or include at least one of doped semiconductor materials (e.g., doped silicon), metals (e.g., tungsten, aluminum, titanium, or tantalum), conductive metal nitrides (e.g., titanium nitride, tantalum nitride, or tungsten nitride), or metal-semiconductor compounds (e.g., metal silicide). A planarization process may be performed on the second conductive layer, until the first interlayered insulating layer 120 is exposed. Accordingly, the first contact plugs 122 may be respectively formed in the cell holes and the source lines SL may be respectively formed in the source grooves. The first contact plugs 122 may be respectively connected to the second doped regions 112, and the source lines SL may be respectively connected to the first doped regions 111. In example embodiments, the ohmic patterns may be formed between the source lines SL and the first doped regions 111 and between the first contact plugs 122 and the second doped regions 112. The ohmic pattern may be formed of, or include at least one of metal-semiconductor compounds including a metal silicide (e.g., cobalt silicide or titanium silicide).

Thereafter, the etch stop layer 124 may be formed on the first interlayered insulating layer 120, the first contact plugs 122, and the source lines SL. The etch stop layer 124 may be formed of, or include silicon nitride and/or silicon oxynitride.

Figure 21:
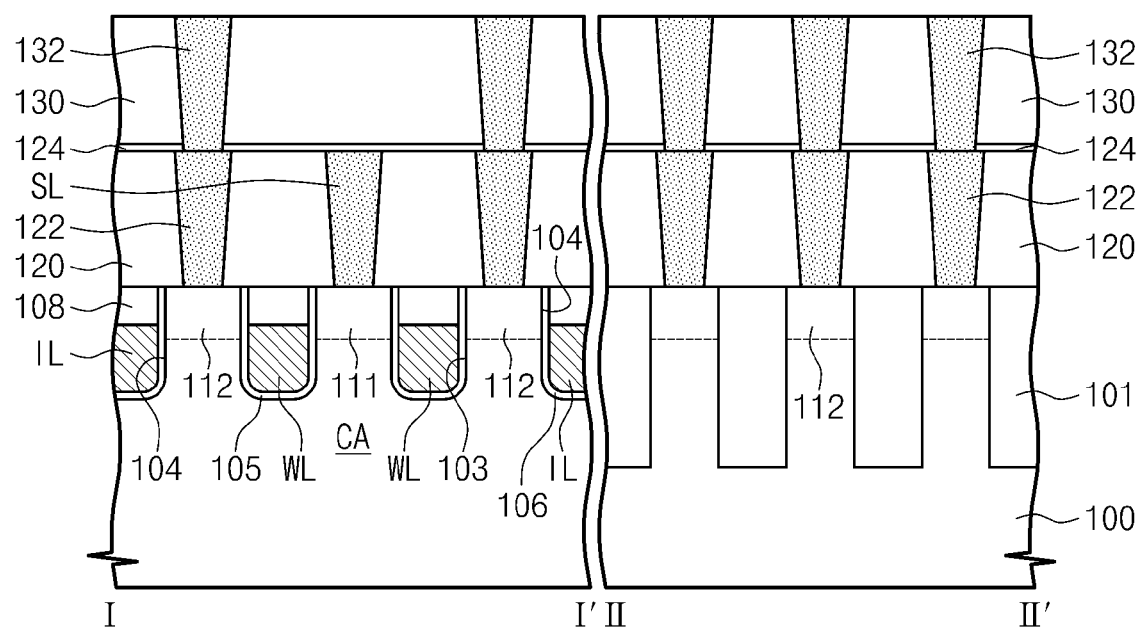

Referring to FIGS. 16 and 21, the second interlayered insulating layer 130 may be formed on the etch stop layer 124. The second interlayered insulating layer 130 may be formed of silicon oxide. The second contact plugs 132 may be formed to penetrate both of the second interlayered insulating layer 130 and the etch stop layer 124. The second contact plugs 132 may be formed by the same method as and of the same material as the first contact plugs 122. The second contact plugs 132 may be electrically and respectively connected to the second doped regions 112 through the first contact plugs 122. In example embodiments, the ohmic pattern may be formed between the second contact plugs 132 and the first contact plugs 122. The ohmic pattern may be formed of, or include at least one of metal-semiconductor compounds including a metal silicide (e.g., cobalt silicide or titanium silicide).

Figure 22:
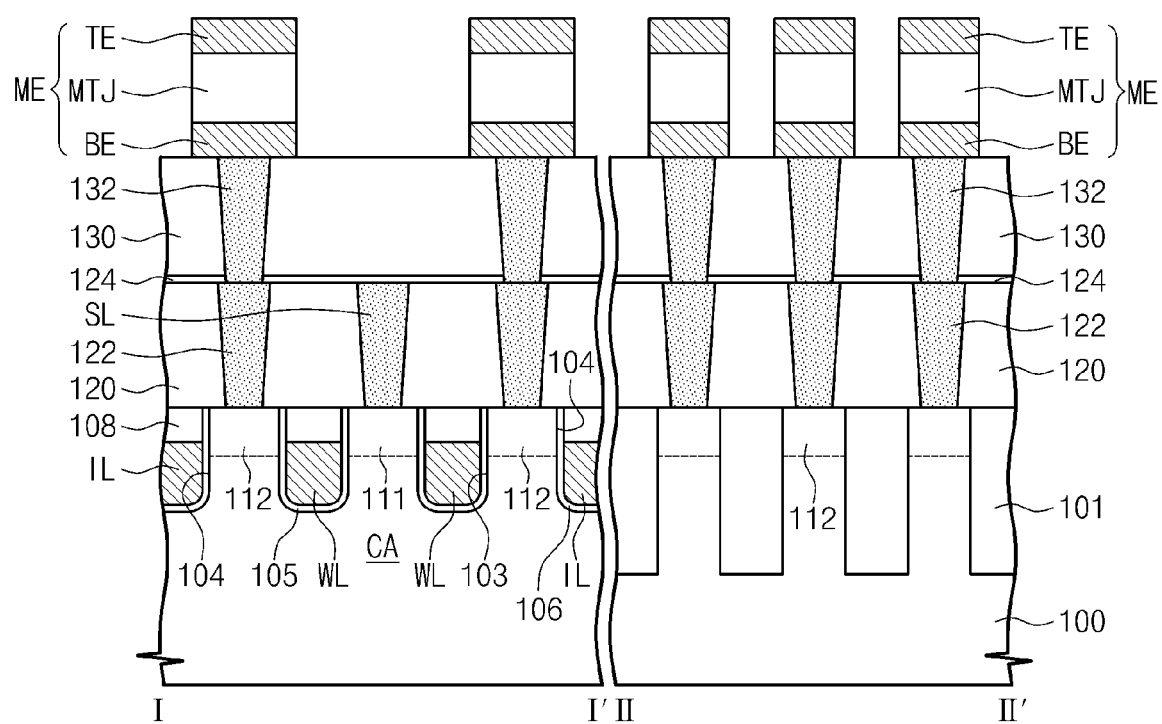

Referring to FIGS. 16 and 22, a plurality of memory elements ME may be formed on the second interlayered insulating layer 130. Each of the memory elements ME may include the lower electrode BE, the magnetic tunnel junction MTJ, and the upper electrode TE. For example, each of the memory elements ME may be formed using the afore-described method of fabricating the memory element ME. As an example, each of the memory elements ME may be patterned to have an island-shaped structure. When viewed in a plan view, the memory elements ME may be overlapped with the second contact plugs 132, respectively.

Referring back to FIGS. 16 and 17, the third interlayered insulating layer 140 may be formed on the second interlayered insulating layer 130 to be in contact with the sidewalls of the memory elements ME. The third interlayered insulating layer 140 may be formed to expose the top surfaces of the memory elements ME.

The bit lines BL may be provided on the third interlayered insulating layer 140. The bit lines BL may extend in the first direction D1. Each of the bit lines BL may be connected in common to a plurality of the memory elements ME arranged along the first direction D1.

According to one or more example embodiments, a tunnel barrier layer including at least two metal oxide patterns and an intervening pattern interposed therebetween may be formed by a process of forming a tunnel barrier layer. During the formation of the tunnel barrier pattern, the intervening pattern between the metal oxide patterns may prevent remnant ion sources (e.g., oxygen ions and/or oxygen radicals) from excessively accumulating at a region adjacent to an interface between a first magnetic pattern and the tunnel barrier pattern. Furthermore, the intervening pattern may contribute to reduce a band gap energy of the tunnel barrier pattern. The low band gap energy of the tunnel barrier pattern may make it possible to increase a magnetoresistance ratio (TMR) of a magnetic tunnel junction. As a result, according to one or more example embodiments, it is possible to realize a magnetic tunnel junction with increased magnetoresistance ratio (TMR), without an increase of resistive area (RA), and consequently, to realize a magnetic memory device with improved characteristics.

While example embodiments have been particularly shown and described, it will be understood by one of ordinary skill in the art that variations in form and detail may be made therein without departing from the spirit and scope of the attached claims.

What is claimed is:

1. A method of fabricating a magnetic memory device, the method of fabricating the magnetic memory device comprising:
    forming a first magnetic layer on a substrate;
    forming a tunnel barrier layer on the first magnetic layer; and
    forming a second magnetic layer on the tunnel barrier layer,
    wherein the forming of the tunnel barrier layer comprises:
        forming a first metal oxide layer on the first magnetic layer;
        forming a first metal layer on the first metal oxide layer;
        forming a second metal oxide layer on the first metal layer; and
        performing a first thermal treatment process to oxidize at least a portion of the first metal layer after the second metal oxide layer is formed.

2. The method of claim 1, wherein the first metal layer comprises at least one among Mg, Fe, Ti, Ta, Al, W, Hf, and V.

3. The method of claim 1, wherein the first metal oxide layer and the second metal oxide layer comprise a same material, and
    wherein the same material comprises at least one among magnesium oxide, titanium oxide, aluminum oxide, magnesium-zinc oxide, and magnesium-boron oxide.

4. The method of claim 1, wherein the first metal oxide layer, the first metal layer, and the second metal oxide layer are formed in situ within a same system as that for the first thermal treatment process.

5. The method of claim 1, wherein the first thermal treatment process is performed at a first temperature of 100 to 500° C. for 10 to 300 seconds.

6. The method of claim 5, further comprising performing a second thermal treatment process after the forming of the second magnetic layer.

7. The method of claim 6, wherein the second thermal treatment process is performed at a second temperature of 350 to 400° C. for 30 to 120 minutes.

8. The method of claim 1, wherein the first metal layer is partially oxidized by the first thermal treatment process to form a first sub oxide and a second sub oxide,
    the first sub oxide is formed to be in contact with the first metal oxide layer, and
    the second sub oxide is formed to be in contact with the second metal oxide layer.

9. The method of claim 8, wherein the first sub oxide and the second sub oxide are formed to have oxygen atom concentrations that are lower than those of the first metal oxide layer and the second metal oxide layer.

10. The method of claim 8, wherein the first thermal treatment process is performed to prevent a part of the first metal layer between the first sub oxide and the second sub oxide from being oxidized.

11. The method of claim 1, wherein the performing the first thermal treatment process comprises oxidizing the first metal layer to form a sub oxide whose oxygen atom concentration is lower than those of the first metal oxide layer and the second metal oxide layer.

12. The method of claim 1, wherein the first metal oxide layer, the second metal oxide layer and the first metal layer contain a same metal element.

13. The method of claim 12, wherein the same metal element is magnesium.

14. The method of claim 1, wherein each of the first metal oxide layer and the second metal oxide layer contain a first metal element, and
    the first metal layer contains a second metal element different from the first metal element.

15. The method of claim 14, wherein the first metal element is magnesium, and
    the second metal element is one among Fe, Ti, Ta, Al, W, Hf, and V.

16. The method of claim 1, further comprising forming a capping oxide layer on the second magnetic layer.

17. The method of claim 1, wherein the forming of the tunnel barrier layer further comprises forming a second metal layer on the second metal oxide layer and forming a third metal oxide layer on the second metal layer, before the first thermal treatment process.

18. The method of claim 17, wherein a sum of thicknesses of the first metal layer and the second metal layer is between 0.1 to 0.2 times that of the tunnel barrier layer.

19. A method of fabricating a magnetic memory device, the method of fabricating the magnetic memory device comprising:
    forming a first magnetic layer on a substrate;

forming a tunnel barrier layer on the first magnetic layer; and forming a second magnetic layer on the tunnel barrier layer, wherein the forming of the tunnel barrier layer comprises:

forming a first metal oxide layer on the first magnetic layer;

forming a first metal layer on the first metal oxide layer;

forming a second metal oxide layer on the first metal layer; and performing a first thermal treatment process to oxidize at least a portion of the first metal layer, wherein a first metal layer thickness ranges from 0.1 to 0.2 times a thickness of the tunnel barrier layer.

20. A method of fabricating a magnetic memory device, the method of fabricating the magnetic memory device comprising:

forming a first magnetic layer on a substrate;

forming a tunnel barrier layer on the first magnetic layer; and forming a second magnetic layer on the tunnel barrier layer, wherein the forming of the tunnel barrier layer comprises:

forming a first metal oxide layer on the first magnetic layer;

forming a first metal layer on the first metal oxide layer;

forming a second metal oxide layer on the first metal layer; and performing a first thermal treatment process to oxidize at least a portion of the first metal layer, wherein the forming of each of the first metal oxide layer and the second metal oxide layer comprises performing a radio frequency (RF) sputtering process using a plurality of targets.

* * * * *